(12) United States Patent
Kanno et al.

(10) Patent No.: US 6,716,301 B2
(45) Date of Patent: Apr. 6, 2004

(54) SEMICONDUCTOR MANUFACTURING APPARATUS AND METHOD OF PROCESSING SEMICONDUCTOR WAFER USING PLASMA, AND WAFER VOLTAGE PROBE

(75) Inventors: Seiichiro Kanno, Chiyoda (JP); Ryoji Nishio, Mito (JP); Tsutomu Tetsuka, Chiyoda (JP); Junichi Tanaka, Tsuchiura (JP); Hideyuki Yamamoto, Kudamatsu (JP); Kazuyuki Ikenaga, Chiyoda (JP); Saburou Kanai, Hikari (JP)

(73) Assignee: Hitachi, Ltd., Tokyo (JP)

( * ) Notice: Subject to any disclaimer, the term of this patent is extended or adjusted under 35 U.S.C. 154(b) by 88 days.

(21) Appl. No.: 09/799,527

(22) Filed: Mar. 7, 2001

(65) Prior Publication Data

US 2001/0025691 A1 Oct. 4, 2001

(30) Foreign Application Priority Data

Mar. 24, 2000 (JP) .......................................... 2000-088503

(51) Int. Cl.[7] .......................... H01L 21/306; C23C 16/00
(52) U.S. Cl. ............................ 156/345.28; 156/345.13; 156/345.15; 156/345.24; 118/712
(58) Field of Search ....................... 156/345.28, 345.13, 156/345.15, 345.24; 118/712

(56) References Cited

U.S. PATENT DOCUMENTS 5,808,415 A 9/1998 Hopkins
5,939,886 A * 8/1999 Turner et al. ........... 315/111.21
6,061,006 A 5/2000 Hopkins
6,091,257 A * 7/2000 Verkuil et al. .............. 324/765
6,197,116 B1 * 3/2001 Kosugi ........................ 118/712

FOREIGN PATENT DOCUMENTS

JP A-7-135180 5/1995

OTHER PUBLICATIONS

Circuits Devices and Systems A First Course in Electrical Engineering by Ralph J Smith Copy right 1966, 1971 and 1976 by John Wiley & Sons Inc Chapter 17 Paragraph 1.*

* cited by examiner

Primary Examiner—Gregory Mills
Assistant Examiner—Ram N Kackar
(74) Attorney, Agent, or Firm—Antonelli, Terry, Stout & Kraus, LLP

(57) ABSTRACT

A semiconductor manufacturing apparatus includes a unit for generating a plasma in a vacuum chamber, a wafer stage for holding a semiconductor wafer introduced into the vacuum chamber, a high frequency power supply for applying a high frequency voltage to the wafer stage, a wafer voltage probe for measuring a voltage of the semiconductor wafer at a rear surface of the semiconductor wafer, a current and voltage probe for measuring at least one of a voltage and a current applied to the wafer stage from the high frequency power supply, and a control portion. The control portion obtains an impedance from the semiconductor wafer to earth through the plasma on the basis of a voltage value of the semiconductor wafer measured by the wafer voltage probe, and a voltage value or a current value measured by the current and voltage probe, and performs a processing based on the obtained impedance.

23 Claims, 16 Drawing Sheets

SEMICONDUCTOR MANUFACTURING APPARATUS AND METHOD OF PROCESSING SEMICONDUCTOR WAFER USING PLASMA, AND WAFER VOLTAGE PROBE

BACKGROUND OF THE INVENTION

The present invention relates to an apparatus, a processing method and a wafer probe for processing a semiconductor wafer using plasma.

Due to high integration of a semiconductor device in recent years, the circuit pattern goes on becoming fine, and the required processing size accuracy has been more and more severe. Furthermore, for the purpose of improving the productivity, besides the enlarging of the diameter of the wafer size is progressing, in order to improve the performance of the devices, the application of new materials and the change of wiring structure are considered. Furthermore, together with this, the development of new processing technique is in progress, and the development of the processing technique is very difficult and costly.

Moreover, in the apparatus of performing the processing of wafers using plasma, among the semiconductor manufacturing apparatuses, for example, in plasma etchers and plasma CVDs, it is very important to accurately grasp and control the energy of ions incident on the substrate, and this leads to the reduction of the start-up period of the process. Conversely, when the ion energy is not accurately grasped, a problem arises in which variations of the performance of the products are caused, and the yield is also decreased.

An example of the method of monitoring and controlling the energy of ions incident on a substrate under plasma processing is disclosed, for example in JP-A-7-135180. In this disclosed example, a method of measuring the voltage of a substrate under processing is disclosed in which the electrode mounting thereon the substrate to be processed is grounded through a condenser, and voltage measuring means for measuring the voltage between the condenser and the electrode is provided.

Furthermore, in U.S. Pat. No. 5,808,415 and U.S. Pat. No. 6,061,006, there are disclosed respectively a manufacturing method of a probe for measuring a current and a voltage applied to plasma, and a manner of obtaining a plasma impedance within a plasma chamber.

SUMMARY OF THE INVENTION

However, in the example disclosed in JP-A-7-135180, as a method of measuring a surface voltage of a substrate in order to control the energy of ions incident on the substrate, a voltage between the electrode mounting thereon the substrate and a condenser connected to this electrode is measured by a voltmeter, and a problem may arise because the voltage of the substrate is not directly measured. For example, in the case of etching processing by fixing the substrate by absorbing by an electrostatic chuck, there is an example, in which as the number of processed wafers is increased, deposition will be attached to the surface of the electrostatic chuck. This will be explained with reference to FIG. 10. In the disclosed example, in order to obtain a surface voltage Vg, a condenser C1 whose capacitance is known is connected to an electrode which mounts thereon a substrate. And the capacitance Cg of the substrate is investigated beforehand, and the voltage Vs is measured by the means shown in the disclosed example, and the surface voltage Vg is obtained by calculating Vs+(C1/Cg) * Vs. In the case where the electrode has the function of the electrostatic chuck, and where a dielectric film or the like is attached to the electrode surface, Cg may be corrected taking the capacitance of the dielectric film into consideration. If the deposition is attached to the surface of the dielectric film just after the start of the etching processing, since the capacitance Cg will be changed, eventually it will not be able to obtain the voltage of the substrate accurately.

Furthermore, in the actual manufacturing apparatus, not only the terminal connected to the electrode is electrically connected to the substrate through the electrode but also there exist an electric circuit connected to earth through a condenser component, and an inductance component of a power supply line for supplying high frequency power. Accordingly, even if a voltage across the condenser connected to the electrode is simply measured, it is not said that the voltage of the substrate is accurately measured.

Also, for example, in the etching processing or the like, when a reaction product or the like has been attached to an inner wall of a vacuum chamber enclosing a plasma, even if the voltage of the substrate could be measured by the method of the disclosed example, in the case where the state of the plasma itself has been changed, there is a possibility that the processed result will be changed even if the voltage of the substrate is controlled.

On the other hand, in the disclosed examples of U.S. Pat. No. 5,808,415 and U.S. Pat. No. 6,061,006, a method of obtaining a real plasma impedance from a current and a voltage waveform exsisting within the discharge is disclosed in which an impedance network of the plasma chamber is expressed by a chamber resistance, an electrode inductance, a stray capacitance between an electrode and ground, and a stray capacitance. However, in the disclosed examples, since the surface voltage of the wafer under processing in the plasma cannot be obtained, there is a problem that the ion energy incident on the wafer cannot be controlled.

In order to solve these problems, it is necessary that both the voltage of the substrate and the plasma impedance are measured or obtained by calculation, and depending on the case, the impedance of the deposition attached to the inner wall of the vacuum chamber is measured or obtained by calculation, and it is necessary to appropriately control the etching parameters based on these information.

Therefore, a first object of the present invention is, in the semiconductor manufacturing apparatus using a plasma, to provide a semiconductor manufacturing apparatus and a processing method in which a voltage of a substrate under processing and an impedance between the substrate and earth through the plasma are measured or obtained by calculation.

A second object of the present invention is, in the semiconductor manufacturing apparatus using a plasma, to provide a semiconductor manufacturing apparatus and a processing method in which a voltage of a substrate under processing and an impedance between the substrate and earth through the plasma are measured or obtained by calculation, and an etching parameter is controlled on the basis of these information.

A third object of the present invention is, in the semiconductor manufacturing apparatus using a plasma, to provide a semiconductor manufacturing apparatus and a processing method in which an appropriate cleaning time can be easily determined by monitoring a thickness of a film deposited on an inner wall of a vacuum chamber.

A fourth object of the present invention is, in the semiconductor manufacturing apparatus using a plasma, to provide a semiconductor manufacturing apparatus and a processing method in which a voltage of a substrate under processing, a voltage of a susceptor disposed to surround the substrate, an impedance to earth through the plasma above the substrate under processing, and an impedance to earth through the plasma above the susceptor are measured or obtained by calculation, and based on theses information, the bias voltage applied to the substrate and the susceptor can be controlled independently.

A fifth object of the present invention is to provide a probe capable of measuring a voltage of the substrate under processing and of the susceptor disposed to surround the substrate.

The first object mentioned above can be achieved, for example, in the semiconductor manufacturing apparatus for precessing a semiconductor wafer using a plasma, by providing a wafer voltage probe for measuring a voltage of the semiconductor wafer from a rear surface of the semiconductor wafer, and a current and voltage probe for measuring at least one of a voltage value and a current value applied to a wafer stage from a high frequency power supply, and by calculating an impedance to earth through the plasma above the semiconductor wafer based on the voltage value of the semiconductor wafer measured by the wafer voltage probe, and the voltage value or the current value measured by the current and voltage probe.

Furthermore, the second object can be achieved, for example, by controlling various processing parameters on the basis of at least one of the obtained impedance and the wafer voltage.

Also, it is possible to achieve, for example, by calculating an impedance based on a voltage and a current measured by the current and voltage probe, and then performing an arithmetic processing of a combined impedance of the impedance calculated above and an equivalent circuit model extending from a high frequency power supply (accurately, the current and voltage probe) to earth through a plasma, which equivalent circuit model being obtained beforehand, thereby to calculate an impedance from the wafer to earth through the plasma and a voltage of the wafer, and by controlling various parameters based on the last mentioned impedance and the voltage of the wafer.

Also, for example, a film thickness probe capable of measuring a film thickness of a film deposited on the inner wall of the vacuum chamber is provided, and if an impedance of the film thickness measured by this probe is calculated, since the impedance (plasma impedance) between the wafer and the surface of the film attached to the inner wall of the vacuum chamber can be accurately calculated, it is only necessary to control various parameters based on this information and it becomes possible to control the etching with sufficient precision.

The third object mentioned above can be achieved, for example, in the semiconductor manufacturing apparatus for processing a semiconductor wafer using a plasma, by providing means capable of measuring a film thickness of the film deposited on the inner wall of the vacuum chamber, and by monitoring the film thickness during processing.

The fourth object mentioned above can be achieved, for example, in the semiconductor manufacturing apparatus for processing a semiconductor wafer using a plasma, by providing a wafer voltage probe for measuring a voltage of the semiconductor wafer from a rear surface of the semiconductor wafer, a current and voltage probe for measuring at least one of a voltage value and a current value applied to a wafer stage from a high frequency power supply, and a susceptor voltage probe for measuring a voltage of a susceptor disposed to surround the semiconductor wafer, and by calculating an impedance to earth through the plasma above the semiconductor wafer and an impedance to earth through the plasma above the susceptor, on the basis of the voltage value of the semiconductor wafer measured by the wafer voltage probe, and the voltage value or the current value measured by the current and voltage probe, and the voltage value of the susceptor measured by the susceptor voltage probe, and by controlling the high frequency voltage applied to the semiconductor wafer and to the susceptor independently.

Also, for example, if a film thickness probe capable of measuring a film thickness of a film deposited on the inner wall of the vacuum chamber is provided, and if the impedance of the film thickness measured by this probe is calculated, since it is possible to calculate the impedance from the wafer to the surface of the film deposited on the inner wall of the vacuum chamber and the impedance from the susceptor to the surface of the film deposited on the inner wall of the vacuum chamber, if various parameters are controlled based on this information, it will become possible to control the etching with sufficient precision.

The fifth object mentioned above can be achieved, for example, by supporting with a resilient member having electrical conductivity, a contact needle having electrical conductivity to make contact with the rear surface of the semiconductor wafer whose voltage is to be measured, and by exposing the resilient member to atmospheric side in a condition electrically insulated from a flange for securing the resilient member to the vacuum chamber, and by measuring the voltage at this portion.

Also, for example, it becomes possible to measure with reproducibility by making adjustable the position of the contact needle in the height direction. Furthermore, if the material of the contact needle is made harder than a hardness of silicon oxide exsisting on the rear surface of the wafer, it will become possible to measure with further reproducibility.

DETAILED DESCRIPTION OF THE EMBODIMENTS

Figure 1:
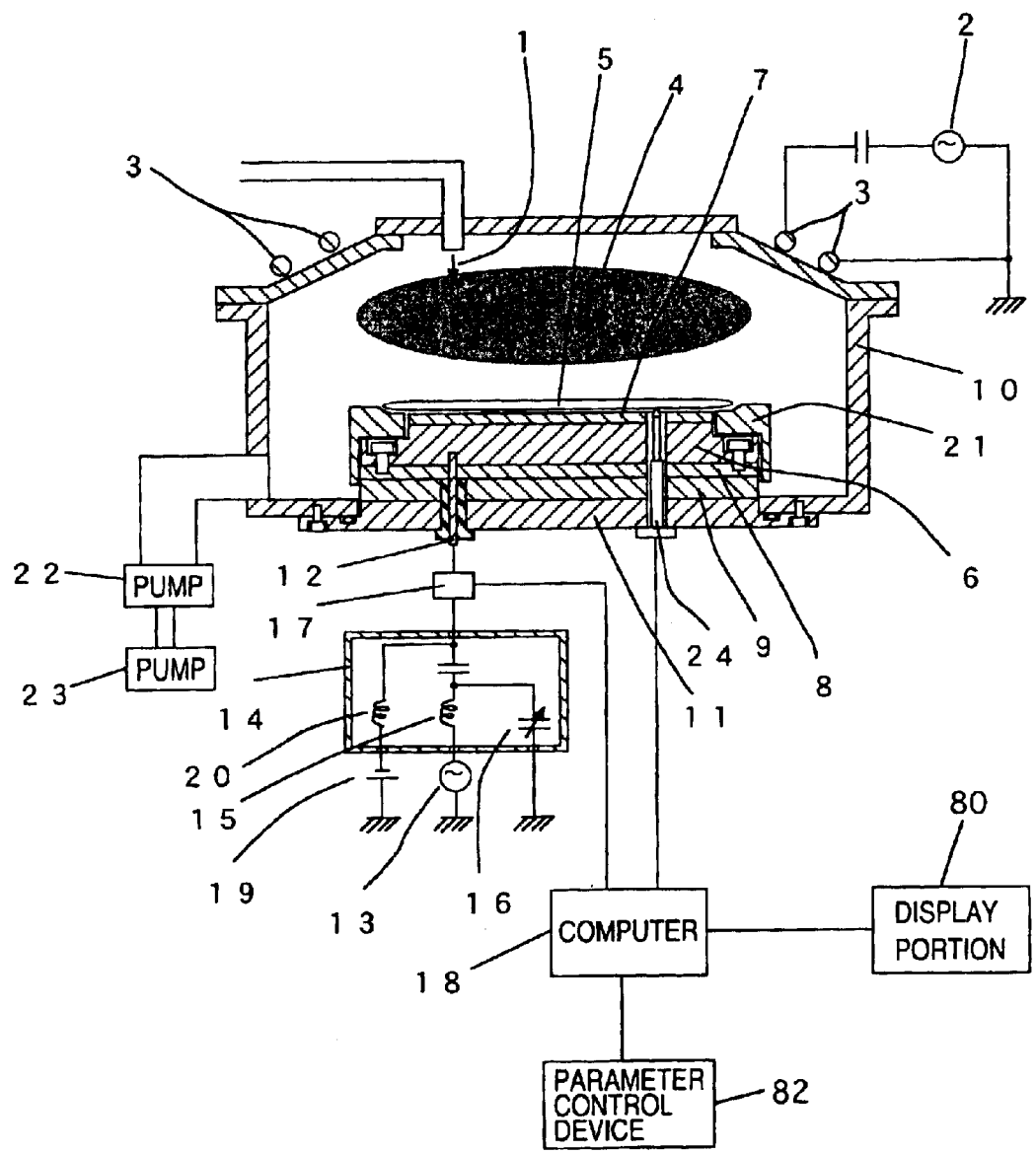
FIG. 1 is a diagram showing a structure example of a plasma etching apparatus according to a first embodiment of the present invention.

Hereinafter, embodiments in which the present invention is applied to a plasma etching apparatus will be explained with reference to the drawings.

First, a first embodiment of the present invention will be explained with reference to FIGS. 1 to 3. In this respect, in the following explanation, components having the same function as those in the first embodiment are attached with the same reference numerals as in the first embodiment, and the explanation is omitted.

FIG. 1 shows an example of a plasma etching apparatus which is the first embodiment of the present invention. Gases 1 introduced into a vacuum chamber 10 is in a plasma 4 condition due to a magnetic field and an electric field produced by a coil 3 which is connected to a high frequency power supply 2 and applied with a high frequency voltage at opposite ends, in which the magnetic field and the electric field respectively couple with the gases inductively and capacitively. A semiconductor wafer 5 is mounted on a wafer stage 6. The wafer stage 6 is attached on the surface thereof with a dielectric film 7 made of ceramics, and the dielectric film 7 has an electrostatic chuck function. The wafer stage 6 is fixed on an electrode 8 by a bolt, and the electrode 8 is electrically insulated from a vacuum chamber 10 by an insulating plate 9. Also the electrode 8 which is electrically connected to the wafer stage 6 is electrically connected to a power supply rod 12 which is electrically insulated from a flange 11, and it is designed such that by using this power supply rod 12 it is possible to feed from an external power supply. In the present embodiment, in order to apply a bias voltage to the wafer 5 to effectively attract ions within the plasma to the wafer, a high frequency power supply 13 having a frequency of 800 kHz is connected to the wafer stage 6 through a matching box 14. Reference numerals 15 and 16 respectively denote an impedance matching coil and a capacitance variable condenser. A voltage value and a current value at an outlet of the matching box 14 are monitored by a current and voltage probe 17, and the output thereof is input to a computer 18 at the outside. The computer 18 includes a calculating portion for obtaining an impedance from the semiconductor wafer to earth through the plasma, and a processing portion for implementing processes (for example, a display process, a parameter control process, etc) based on the obtained impedance, or the like. Furthermore, the power supply rod 12 is also connected to a direct current power supply 19 to enable the electrostatic chuck function. This direct current power supply 19 is connected through a coil 20 to cut the high frequency voltage, and when the direct current voltage is applied to the wafer stage 6 under the ignited condition of the plasma 4, a direct current voltage circuit is formed in the wafer 5 through the plasma 4 which is at the ground voltage because it is in contact with the vacuum chamber 10. As a result, a potential difference is developed between the wafer 5 and the electrode 8, and electric charge is charged on the dielectric film 7 and the wafer 5 is absorbed by coulomb's force. Numeral 21 denotes a cover for protecting the outer periphery of the wafer stage 6 and the electrode 8 from the plasma 4. Numerals 22 and 23 denote respectively a turbo-molecular pump and a dry pump for exhausting the gases and reaction products. Numeral 24 denotes a wafer probe for measuring a voltage of the wafer 5 during plasma processing. A display portion 80 is used to display and monitor the impedance or the like obtained by the computer 18, and it is, for example, a CRT or the like. A parameter control device 82 controls various parameters of the semiconductor manufacturing apparatus (plasma etching apparatus) in accordance with a command from the computer 18.

Figure 2:
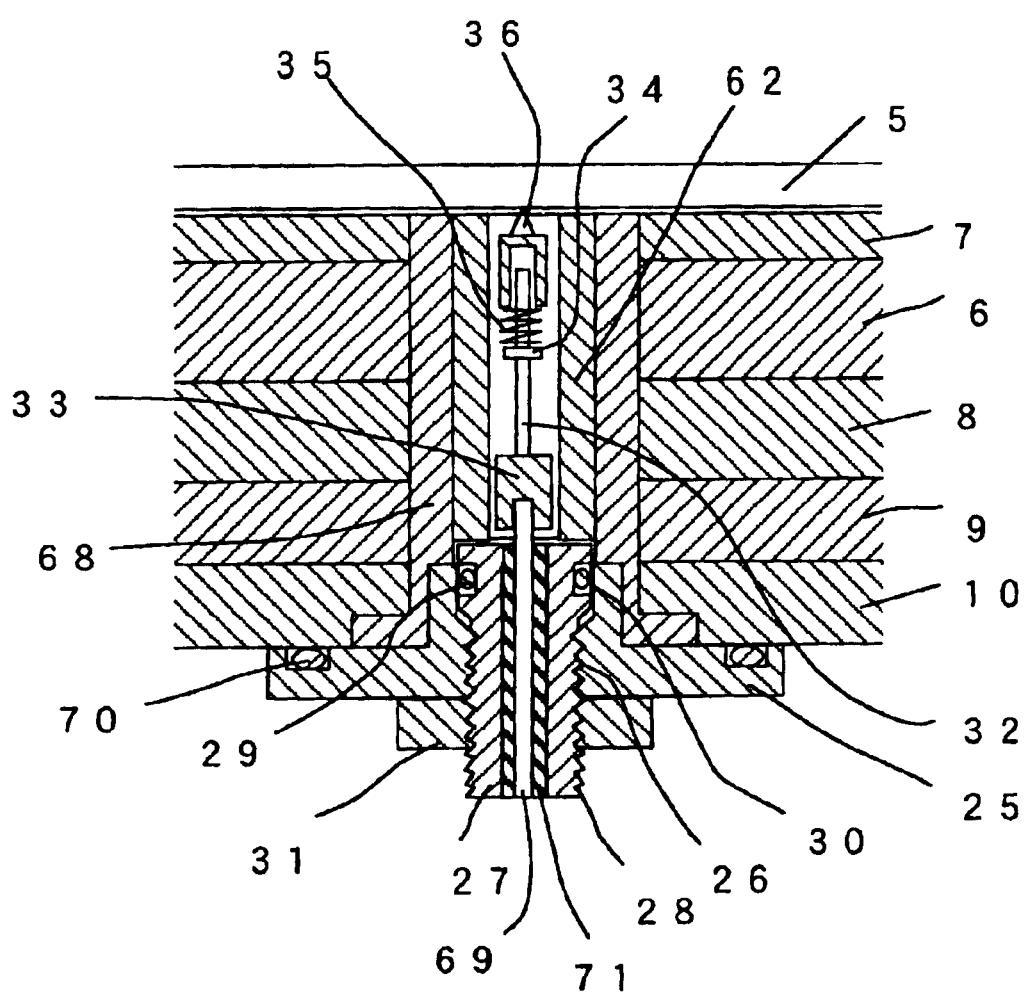
FIG. 2 is a sectional diagram showing a structure example of a wafer voltage probe used in the present invention.
Figure 3:
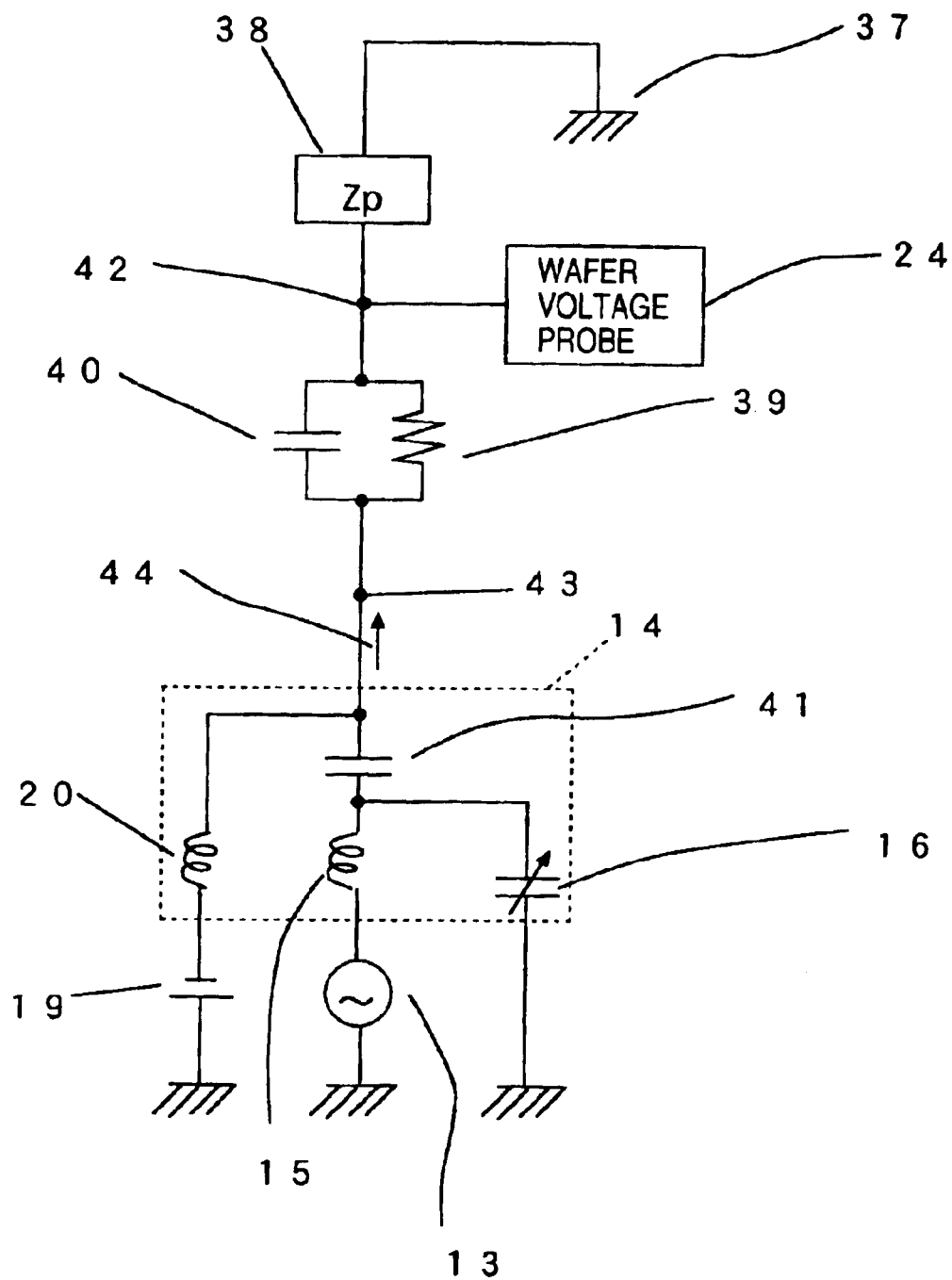
FIG. 3 is an equivalent circuit diagram of an important portion of the first embodiment of the present invention.

FIG. 2 shows a detailed structure diagram of a wafer voltage probe 24. In FIG. 2, the wafer voltage probe 24 is made up of components other than those denoted by numerals 5 to 10. The wafer voltage probe 24 used in the present invention, includes a contact needle 36 having electrical conductivity and placed in contact with a rear surface of the semiconductor wafer 5 to be measured, a resilient member 35 having electrical conductivity for supporting the contact needle 36, and a current introducing terminal 27 having a flange structure while supporting the resilient member 35, and the voltage of the contact needle 36 can be measured at the atmospheric side, and the position of the contact needle 36 in the height direction is adjustable from the atmospheric side. Its structure will be explained in detail below.

A through hole is formed in the vacuum chamber 10, the insulating plate 9, the electrode 8, and the wafer stage 6, and an insulating pipe 68 made of ceramics is embedded into the through hole to electrically insulate the probe 24 from the electrode 8 and the wafer stage 6. The wafer voltage probe 24 has a flange 25 structure so as to be mountable on the vacuum chamber 10, and is sealed to hold vacuum by an O-ring 70. A through hole is formed at the center of the flange 25, and a female thread 26 is formed at one part of the through hole. The terminal 27 for measuring the voltage of the wafer 5 is mounted into the through hole. The terminal 27 has in its inside a hollow insulating pipe 71 embedded therein, and further an electrically conductive core wire 69 is embedded in the inside of the insulating pipe 71. The teminal 27 has a male thread on a part of the outer peripheral surface, and fitted into the female thread 26 formed in the flange 25. Furthermore, an O-ring 29 is provided on an upper portion of the terminal 27 so as to seal an inner surface 30 thereof. At the end of the core wire 69 at the vacuum side, there is a connecting rod 32. This connecting rod 32 has at one end a socket 33 structure so as to receive the core wire 69, and a coil spring 35 is mounted on the other end of the connecting rod 32 using a spring stop 34. The contact needle 36 is mounted on an upper portion of the coil spring 35 so as to be drivable up and down along the connecting rod 32. The contact needle 36 is mounted so that the tip end is protruded beyond the face of the wafer stage 6, and when the wafer 5 is placed, the contact needle 36 moves downward due to the weight of the wafer 5. The amount of this protrusion is determined depending on the balance with the spring constant of the coil spring 35. Desirably, the degree of protrusion may be such that when the semiconductor wafer 5 is mounted on the wafer stage 6, the contact needle 36 sinks down to the wafer stage 6 due to the own weight of the wafer 5. Furthermore, the contact needle 36 is made of an electrically conductive material, and its tip end has a radius of curvature and a hardness to penetrate through an oxide film and a nitride film existing on the rear surface of the semiconductor wafer 5. In the present embodiment, the material of the contact needle 36 is tungsten carbide, however, other materials, for example, electrically conductive diamond, etc. may be utilized. The value of the radius of curvature should be determined by the spring constant of the coil spring 35 and the amount of protrusion of the contact needle 36, that is, the amount of deformation of the spring, and actually, it is determined suitably by the condition of the semiconductor wafer 5 which is the object of measurement. As an example, in the case where the spring constant of the coil spring 35 is k, the amount of protrusion is L, and an oxide film of t thickness is formed on the rear surface of the 8-inch wafer, a required radius of curvature is shown by R. Supposing that the weight of 8-inch wafer is given by w, and the Young's modulus and the Poisson's ratio of the contact needle 36 are respectively given by En and vn, and the the Young's modulus and the Poisson's ratio of the oxide film are respectively given by Ew and vw, a radius a of a contact circle between the tip end of the contact needle and the oxide film on the rear surface of the wafer can be expressed by equation (1).

$$a=\{3WR((1-vn^2)/En+(1-vw^2)/Ew)/4\}^{1/3} \quad (1)$$

At this time, a pressure at the contact center can be calculated by equation (2).

$$p=3W/2\pi a^2 \quad (2)$$

When this pressure p is larger than the hardness of the oxide film, the contact needle penetrates through the oxide film, and electrically contacts the conductive silicon, and it becomes possible to measure the voltage of the wafer. That is, supposing that Vickers harness of the oxide film is given by Hv, the radius of curvature R is only required to satisfy equation (3).

$$Hv<p \quad (3)$$

The amount of protrusion when the wafer 5 is not mounted, is determined by adjusting the position of the terminal 27 mentioned above. In order to easily judge from the atmospheric side the amount of protrusion of the tip end of the contact needle 36 from the dielectric film 7, if a scale is attached to the terminal 27 at the atmospheric side, the work will become more easy. It is possible to fix the contact needle 36 after the position thereof is determined, by mounting a nut 31 at the atmospheric side of the terminal 27, and the position of the terminal 27 in the up and down direction may be set arbitrary. Accordingly, since it is possible to observe a voltage substantially equal to that of the wafer 5 during processing at the core line 69 of the terminal 27, the voltage of the wafer 5 can be measured by measuring the voltage of the core wire 69 by a voltmeter. Furthermore, numeral 62 denotes an insulating cylinder for electrically insulating the probe 24 from the wafer stage 6, the electrode 8, and the insulating plate 9.

Subsequently, the manner of obtaining the impedance (plasma impedance) from the wafer 5 to earth through the plasma will be explained. FIG. 3 shows in the first embodiment of the present invention, an equivalent circuit model from the high frequency power supply 13 (correctly, the current and voltage probe 17) to earth through the wafer stage 6. This equivalent circuit model may be investigated beforehand by impedance measuring equipment or the like. When explaining the numerals in FIG. 3, numeral 37 denotes a voltage of the vacuum chamber 10 and this is earth. Numeral 38 denotes the plasma impedance above the wafer 5, numeral 39 denotes a resistance component of the dielectric film 7, numeral 40 denotes a capacitance component of the dielectric film 7, and numeral 41 denotes a blocking condenser, and the other numerals are as mentioned above. The voltage 42 Vw of the wafer 5 measured by the wafer voltage probe 24, the voltage 43 Ve of the electrode 8 connected to the outlet of the matching box 14, and the measured value of the current 44 Ie flowing into the electrode 8 are fetched to the computer 18. When the plasma impedance 38 is expressed by Zp, the voltage applied to Zp at a certain time is the output voltage of the wafer voltage probe 24, that is, the wafer voltage Vw, and the current flowing in Zp is the current 44 Ie which flows into the electrode 8, and hence, Zp can be calculated by Vw/Ie. The value of this Zp is sequentially arithmetically processed within the computer 18, and it is possible to read. In the present embodiment, in order to obtain Zp. as the voltage value, not the voltage at the outlet of the matching box 14, that is, the voltage 43 Ve of the electrode 8, but the voltage 42 Vw of the wafer 5 actually under processing is measured. The reason for is that, in the present embodiment, in order to make the surface of the wafer stage 6 have the electrostatic chuck function, the dielectric film 7 is mounted, as a result, the voltage drop occurs at this portion, and the voltage at the output of the matching box 14, that is, the voltage Ve of the electrode 8 does not become the voltage of the wafer 5. In other words, in order to obtain the value of the plasma impedance, when the voltage value Ve measured at the outlet of the matching box 14 is used to calculate Ve/Ie, the resultant value is not identical with the actual plasma impedance.

One example of the problem in the case of calculating the plasma impedance by Ve/Ie is considered to occur in such a case where, as the number of processed wafers increases, a deposition film is attached to the surface of the dielectric film 7 on the wafer stage 6, When the deposition film is attached and the capacitance of the dielectric film 7 is decreased, since the impedance is increased, the voltage at the outlet of the matching box 14 rises. Accordingly, although there is no change in the plasma condition, it will be judged as if the plasma impedance has been increased. Based on this information, if the voltage Ve of the electrode 8 is reduced to maintain the etching rate at constant, the etching rate would be lowered, and unsatisfactory etching would be caused. Conversely, if the power supplied from the plasma producing high frequency power supply 13 is increased to lower the plasma impedance, the etching rate would be increased too high, resulting in over etching. Thus, causing unsatisfactory etching.

In contrast, when the impedance Zp is obtained by the constitution of the present embodiment, since the result of direct measurement of the voltage of the wafer 5 is utilized in order to calculate the plasma impedance, more accurate impedance and the voltage of the wafer 5 can be obtained by measurement or calculation. Thus, for example, since the energy incident on the wafer 5 under processing, that is, the bias voltage of the wafer 5 can be suitably adjusted, the unsatisfactory etching can be prevented.

Figure 11:
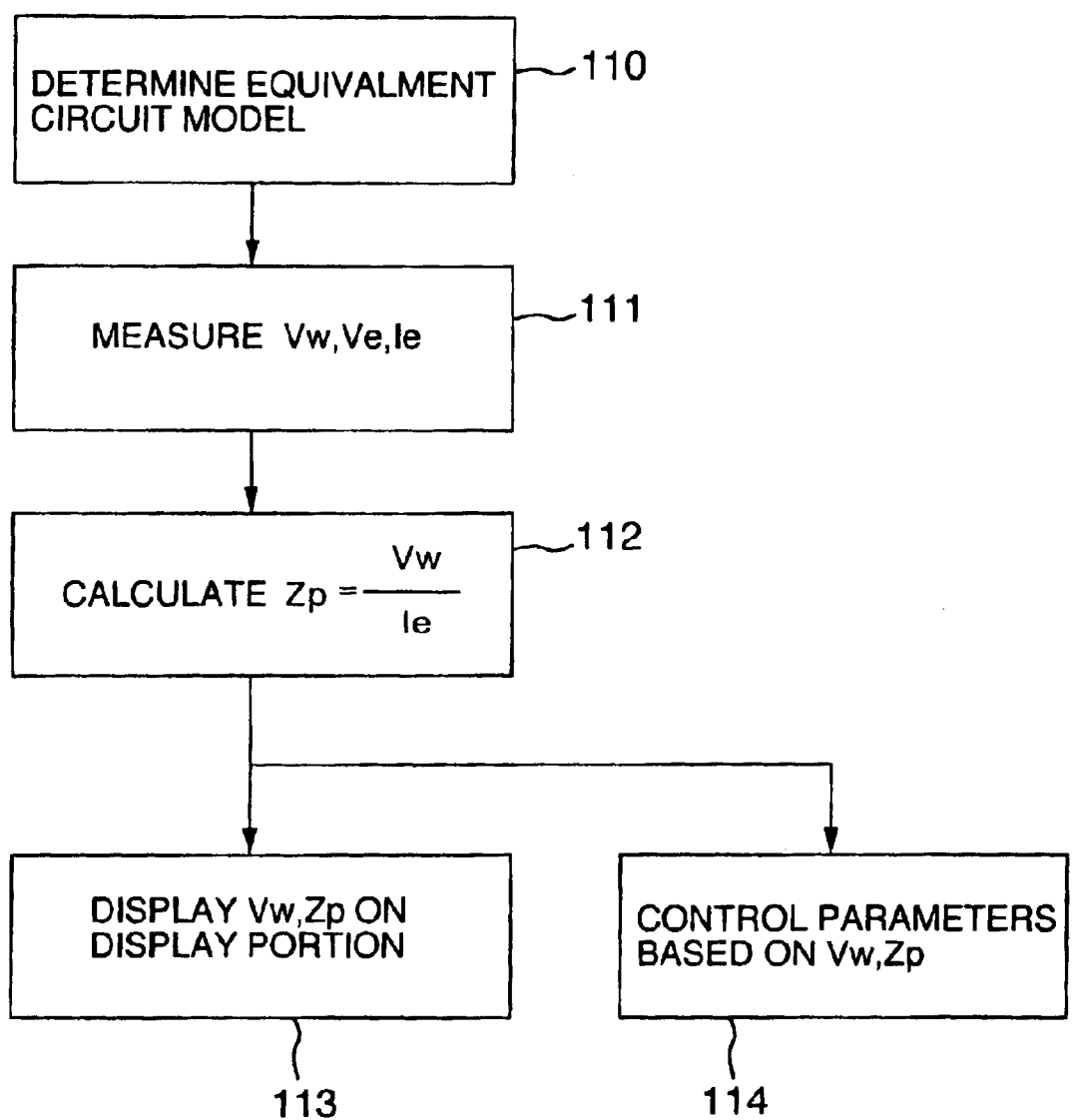
FIG. 11 is a flow chart for explaining a calculation processing of an impedance in the first embodiment.

Hereinafter, a flow chart showing the flow of the processing in the first embodiment of the present invention for obtaining the wafer voltage Vw and then utilizing the same is shown in FIG. 11. In this respect, the processing from FIGS. 11 to 16 is implemented by a program within the computer 18 shown in FIGS. 1, 4, 6 and 8. First, the equivalent circuit model from the high frequency power supply 13 (correctly, the current and voltage probe 17) to earth through the wafer stage 6 is determined as shown in FIG. 3 (step 110). Next, the wafer voltage Vw, the current Ie, and voltage Ve of the wafer stage 6 are measured by using the wafer voltage probe 24 and the current and voltage probe 17 (step 111). Next, the plasma impedance Zp is calculated by the computer 18 which fetched the measurement results (step 112). Although it should be decided by the user eventually, when the wafer voltage Vw and the plasma impedance Zp are to be monitored, these values are displayed on the display portion 80 (step 113). Furthermore, when the processing parameters are to be controlled based on the obtained impedance or the like, the computer 18 sends a signal, and information to the parameter control device 82, and the parameter control device 82 sends a control signal to the portions which are the objects of parameter control, for example, to the high frequency power supply 13 and the like thereby to control various parameters (step 114).

Furthermore, in the case where there exists a condition that the state of the vacuum chamber inner wall does not change due to the plasma processing, or a certain condition is maintained by cleaning (deposition film is not present on the vacuum chamber inner wall), the impedance calculated as mentioned above is determined as the impedance from the semiconductor wafer 5 to the vacuum chamber inner wall through the plasma, and by controlling various processing parameters on the basis of that calculated impedance, it is possible to process the semiconductor wafer 5 under processing by the plasma.

As mentioned above, according to the present invention, since it is possible to process while accurately measureing the voltage of the wafer 5, while monitoring the state of the plasma by the plasma impedance, if the voltage of the wafer 5 is controlled based on these results, since the ion energy correctly incident on the wafer can be utilized, it is possible to achieve the etching with sufficient reproducibility, and to prevent the reduction of the yield.

In the present embodiment, while it is explained as to the case where the bias voltage is controlled as the parameter which is controlled by using the plasma impedance, it is not necessarily limited only to this. As the other control parameters, for example, the frequency or power of the high frequency power supply to generate the plasma, the frequency or voltage or power of the high frequency power supply applied to the wafer stage 6, the temperature or temperature distribution of the wall of the vacuum chamber. The temperature or temperature distribution of the wafer 5, the processing pressure, the gas type and flow rate and mixture ratio of the processing gas, the intensity and intensity distribution of the magnetic field applied to the plasma, the etching time, and the like may be included. Also, it is considered to control by combining a plurality of these parameters.

Furthermore, the semiconductor products manufactured by the processing method described in the present embodiment provide an important advantage as compared with the products manufactured without applying the method of the present embodiment. That is, since the processing of the wafer is always performed in the range of a certain condition, the applied processing has fully satisfactory reproducibility, and thus, there is no variation in performance among the products, and highly reliable products are obtained. Therefore, since the yield during the manufacturing is good, the cost is low, and inexpensive products are provided.

In the present embodiment, the plasma impedance is obtained by calculation based on the voltage of the wafer 5 and the voltage value and current value at the outlet of matching box 14, and the etching parameters are controlled based on this result, however, in the actual utilization method it is not necessarily limited to only the control of the etching parameters. For example, it will be considered to utilize the plasma impedance as the monitor of the etching condition, and depending on the case, it will be considered to monitor the voltage of the wafer and the voltage and current at the outlet of the matching box 14, and based on the information of a change in these values, to decide the time of stopping the apparatus and the time of maintenance of the apparatus. For example, increasing the number of the wafers processed by etching while monitoring the wafer voltage, if a rapid change in the wafer voltage is recognized during a certain processing, it will be possible to easily predict that some abnormality occurred. In other words, it can be utilized as a monitor whether the etching processing is normally progressing, and in this case since it can be judged instantly that the abnormality occurred in the apparatus, the waste of the wafer can be suppressed to a minimum.

Furthermore, in the present embodiment, although the rod member having the coil spring 35 is utilized as the resilient member for supporting the contact needle 36, this is not required necessarily, and a leaf spring may be utilized. The important requirement is that the contact needle 36 has the resiliency in the vertical direction, and the position of the whole contact needle 36 is arbitrary adjustable from the main body side.

Furthermore, in the present embodiment, although the probe 24 of the type which directly contacts the rear surface of the wafer 5 is used as the probe for measuring the voltage of the wafer 5, it is not necessarily limited to this. For example, such a method will be considered in which a non-contact electrometer of the electrostatic capacity type is embedded in the wafer stage 6, and the voltage of the wafer 5 is measured by this electrometer. However, in this case, since it is presumed that the absolute value of the voltage of the wafer is changed depending on the mounting position of the electrometer, it will be necessary to have the structure which allows to adjust the mounting position from the outside of the vacuum chamber as in the present embodiment.

Furthermore, in the present embodiment, in order to obtain the impedance (plasma impedance) from the wafer 5 to earth through the plasma 4, the voltage of the wafer 5 is actually measured. However, the impedance and the voltage of the wafer 5 can be obtained by calculation from the equivalent circuit model and the voltage 43 Ve of the electrode 8 and the current 44 Ie flowing into the electrode 8 connected to the outlet of the matching box 14. This method is an effective method in such a process in which the degree of cleanliness due to wear powder (foreign substance) from the rear surface of the wafer 5 produced by the contact and slidable movement of the contact needle 36 of the wafer voltage probe 24 with respect to the rear surface of the wafer 5 is also the problem. For example, the case in which the foreign substance deposited on the rear surface of the wafer 5 is transferred to the front surface of the wafer 5 in the processing (e.g., wet washing, etc.) which is carried out next to the plasma processing. Hereinafter, it will be explained.

First, the phase difference $\theta$ is obtained in advance by the arithmetic processing by the computer 18 which fetches a waveform Ve (t) due to a change in time of the voltage 43 Ve and a waveform Ie (t) due to a change in time of the current 44 Ie of the electrode 8. At this time, the impedance at the outlet of the matching box 14 is expressed by an imaginary number a+bj. Here, $$a = z/(1 + (\tan\theta)^2)^{0.5},$$

$$(b = z*\tan\theta/(1 + (\tan\theta)^2))^{0.5},$$

$$z = Ve/Ie$$

Similarly, the plasma impedance is expressed by an imaginary number c+dj. The above-mentioned plasma impedance Zp has the magnitude of c+dj expressed by the imaginary number, and in this case, it becomes $(c^2+d^2)^{0.5}$. At this time, the combined impedance Z total from the outlet of the matching box 14 to earth through the plasma 4 is expressed by the following equation by using a resistance component 39 (R (ohm)) and a capacitance component 40 (Xc (ohm)).

$$Ztotal = (c + R*Xc^2/(R^2 + Xc^2)) + (d - R^2*Xc/(R^2 + Xc^2))j$$

Since this combined impedance Ztotal is equal to the impedance a+bj at the outlet of the matching box 14, by comparing the real number component with the imaginary number component, the values of c and d can be obtained from the equation below.

$$Z/(1 + (\tan\theta)^2)^{0.5} = c + R*Xc^2/(R^2 + Xc^2)$$

$$Z*\tan\theta/(1 + (\tan\theta)^2)^{0.5} = d - R^2*Xc/(R^2 + Xc^2)$$

If the values of c and d are obtained, the plasma impedance Zp and the wafer voltage Vw are calculated by the equation below.

$$Zp = (c^2 + d^2)^{0.5}$$

$$Vw = Ie*Zp$$

By calculating in such a procedure, there is no need to measure the wafer voltage Vw by the probe 24. Accordingly, such a situation does not occur in which the wear powder (foreign substance) is produced from the rear surface of the wafer 5 due to the contact and slidable movement of the contact needle of the wafer voltage probe 24 with respect to the rear surface of the wafer 5, and the degree of cleanliness is lowered. However, in the present embodiment, in such a case where the deposition film is attached onto the wafer stage 6, there is a problem that since the value itself of the equivalent circuit model is changed, the accuracy will be lost. However, under such a condition in which the condition can be maintained at constant by performing the processing while cleaning the front surface of the wafer stage 6 by the plasma 4, it is possible to utilize as a method of monitoring the clean plasma impedance.

Figure 12:
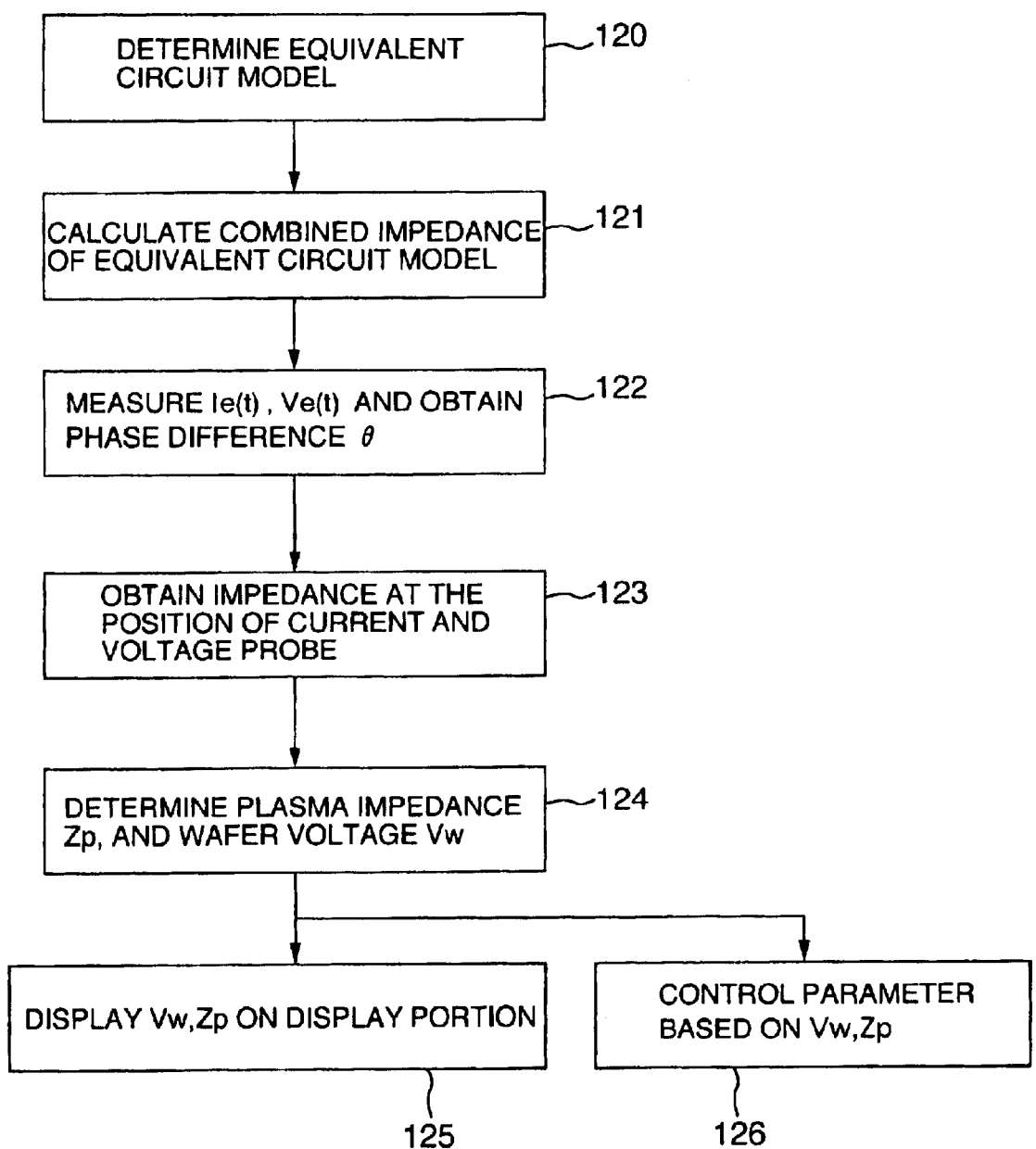
FIG. 12 is a flow chart for explaining another calculation processing of an impedance in the first embodiment.
Figure 13:
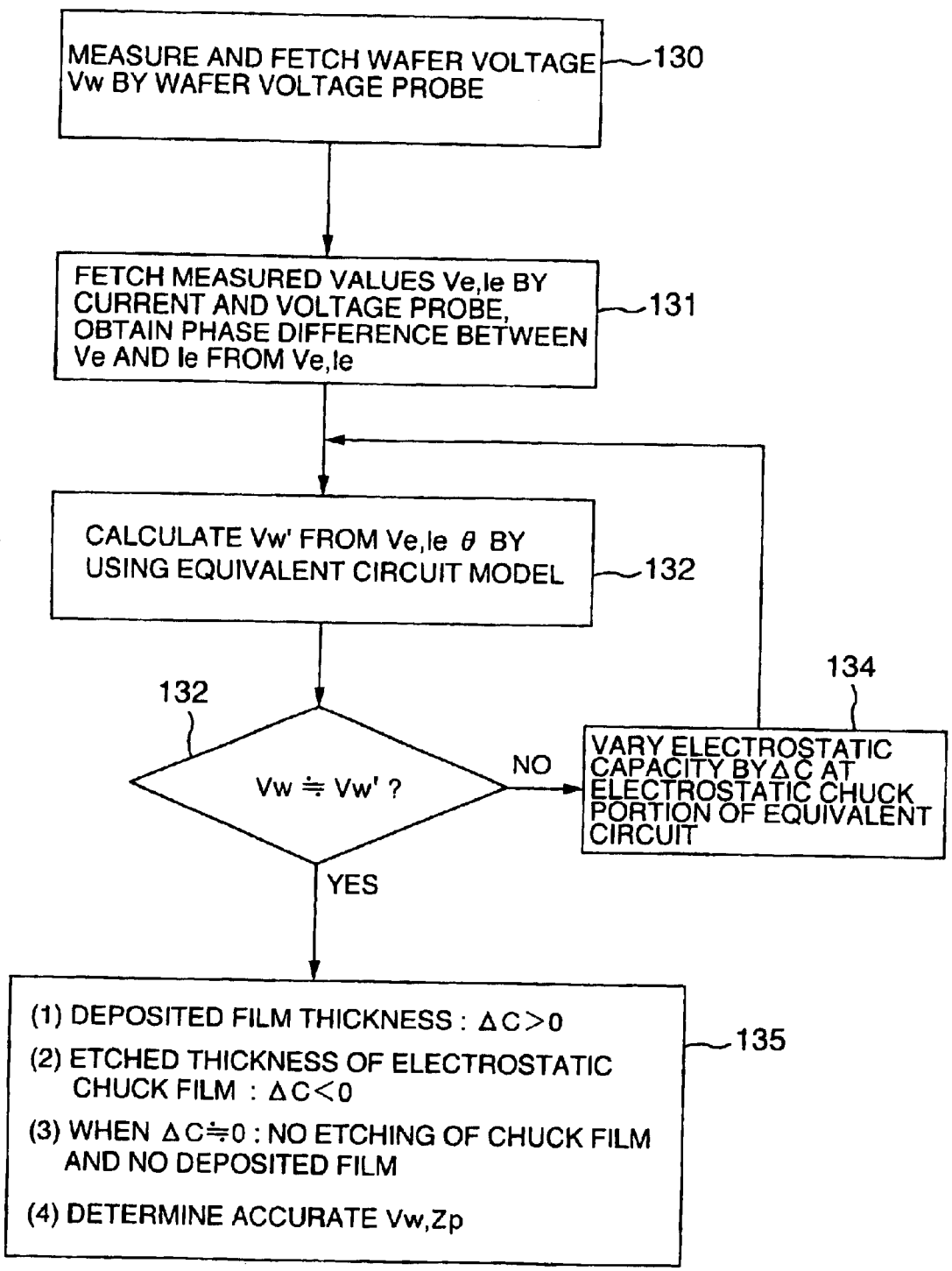
FIG. 13 is a flow chart for explaining a monitor processing of a deposition condition on a dielectric film surface of a wafer stage in the first embodiment.

FIG. 12 shows a flow chart of the flow in which the wafer voltage Vw and the plasma impedance Zp are obtained by the method mentioned above, and the obtained data is utilized. First, the equivalent circuit model from the high frequency power supply 13 (correctly, the current and voltage probe) to earth through the wafer stage 6 in the present embodiment is determined as shown in FIG. 3 (step 120). Next, the combined impedance from the current and voltage probe 17 to earth through the plasma 4 is calculated (step 121). Next, by using the current and voltage probe 17, the waveform Vw (t) of the wafer voltage, and the waveform Ie (t) of the current of the wafer stage 6 are measured, and the phase difference is obtained (step 122). Next, on the basis of these values, the impedance at the position of the current and voltage probe 17 is calculated (step 123). Next, by comparing the combined impedance calculated previously with the impedance obtained in step 123, the plasma impedance Zp, and the wafer voltage Vw are calculated (step 124). Although it should be decided eventually by the judgement of the user, when the wafer voltage Vw and the plasma impedance Zp are to be monitored, these data are displayed on the display portion 80 (step 125), and in the case of controlling the process parameters, the information is sent to the parameter control device 82, and the process parameters are controlled (step 126).

In the method mentioned above, the current Ie flowing into the electrode 8 is measured necessarily, however, it is possible to obtain the current Ie by calculation, and to calculate the plasma impedance. In this case, the voltage waveform Vw (t) of the wafer 5 and the voltage waveform Ve (t) of electrode 8 are obtained by the wafer voltage probe 24, and the current waveform Ie (t) flowing into the circuit may be calculated from the impedance Zm of the dielectric film portion. At this time, the impedance Zd of the dielectric film portion and the current waveform Ie (t) can be calculated by the equation below.

$$Zd = RX \ c^2/(Xc^2 + R^2) - jX \ c \ R^2/(Xc^2 + R^2)$$

$$Ie(t) = (Vw(t) - Ve(t))/Zd$$

From this result, the plasma impedance Zp is calculated by the equation below.

$$Zp=Vw/Ie$$

Three ways of calculation method of the plasma impedance are shown above, however, which way is to be used may be suitably selected depending on the process.

Figure 14:
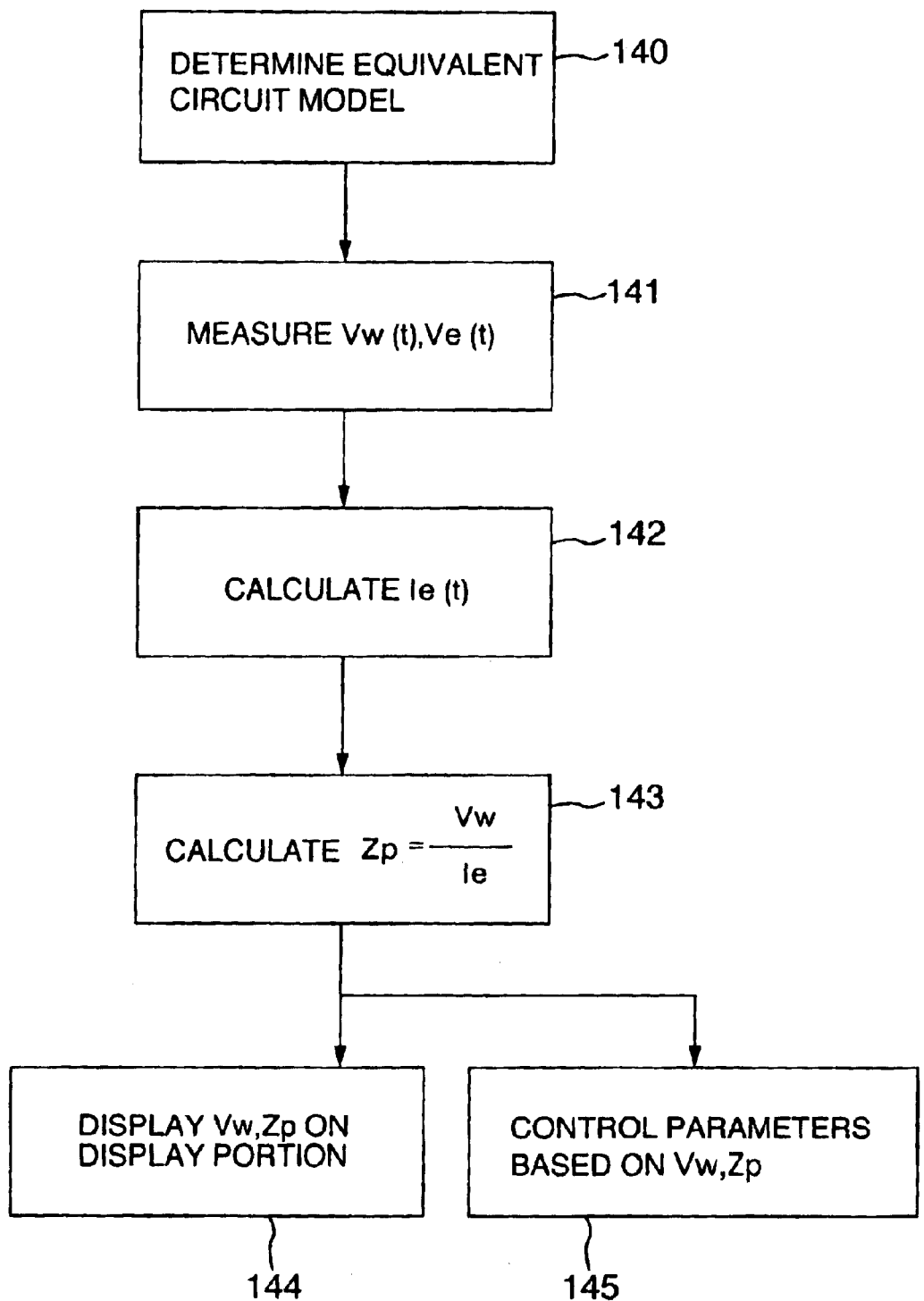
FIG. 14 is a flow chart for explaining a utilization processing of a plasma impedance obtained in the first embodiment.

FIG. 14 shows a flow chart showing the flow of the process of obtaining the wafer voltage Vw and the plasma impedance Zp, and utilizing the result. First, the equivalent circuit model is determined as shown in FIG. 3 (step 140). Next, the voltage waveform Vw (t) of the wafer 5 and the voltage waveform Ve (t) of the wafer stage 6 are measured by the current and voltage probe 17 (step 141). Next, from the equivalent circuit model and the voltage waveforms obtained in step 141, the current waveform Ie (t) of the wafer stage 6 is calculated (step 142). Next, the plasma impedance Zp is calculated (step 143). Although it should be decided by the judgement of the user eventually, in the case of monitoring the wafer voltage Vw and the plasma impedance Zp, these data are displayed on the display portion 80 (step 145), and in the case of controlling the process parameters, the information is sent to the parameter control device 82, and the process parameters are controlled (step 146).

Furthermore, conversely, if the voltage of the wafer is calculated by the equivalent circuit mentioned above, while actually measuring the wafer voltage by the wafer voltage probe 24, it becomes possible to display on the display portion 80 the state of the deposition on the dielectric film surface of the wafer stage 6. The procedure will be explained by using FIG. 13. First, the current waveform Ie (t) and the voltage waveform Ve (t) of the wafer stage 6 are measured by the current and voltage probe 17, and the phase difference θ is obtained (step 131). Next, by using the equivalent circuit model of FIG. 3, the voltage Vw' of the wafer 5 is calculated from Ie, Ve, and θ (step 132). Next, the difference Vw−Vw' between the wafer voltage Vw measured by the wafer voltage probe 24 and the wafer voltage Vw' is obtained (step 133). If, the deposition film is not attached on the surface of the dielectric film 7, and the surface of the dielectric film 7 is not reduced by etching, and there is no problem in the state, since the voltage of the wafer measured by the wafer voltage probe 24 and the wafer voltage obtained by calculation by the equivalent circuit model are substantially coincide with each other, the value of difference Vw–Vw' is near zero. Specifically, the range of the values of Vw–Vw' is determined beforehand, and if it falls in a certain range, the wafer voltage Vw and the plasma impedance Zp are output. In this case, it is recognized that there is no problem. If, the deposition film is attached on the dielectric film surface and the film thickness is increased, or the film thickness is reduced by being etched, the difference between Vw and Vw' assumes a value which exceeds a certain range. In this case, the value C of the capacitance 40 of the dielectric film 7 is changed by ΔC, (step 134), and based on the value C' (=C+ΔC) of the changed capacitance 40 of the dielectric film 7, Vw' is calculated again and the difference Vw–Vw' is obtained (step 132). When the value Vw' again calculated falls within the predetermined range, ΔC, Vw and Zp are obtained, and the judgement is performed (step 135). In other words, when the value of ΔC is positive, this is the case where the film thickness is decreased due to the etching of the surface of the dielectric film 7, whereas when the value of ΔC is negative, it can be judged that the film thickness became thick due to the attachment of the deposition film on the surface of the dielectric film 7. As mentioned above, it is possible to utilize as the monitoring of the deposition film to the dielectric film 7.

Figure 6:
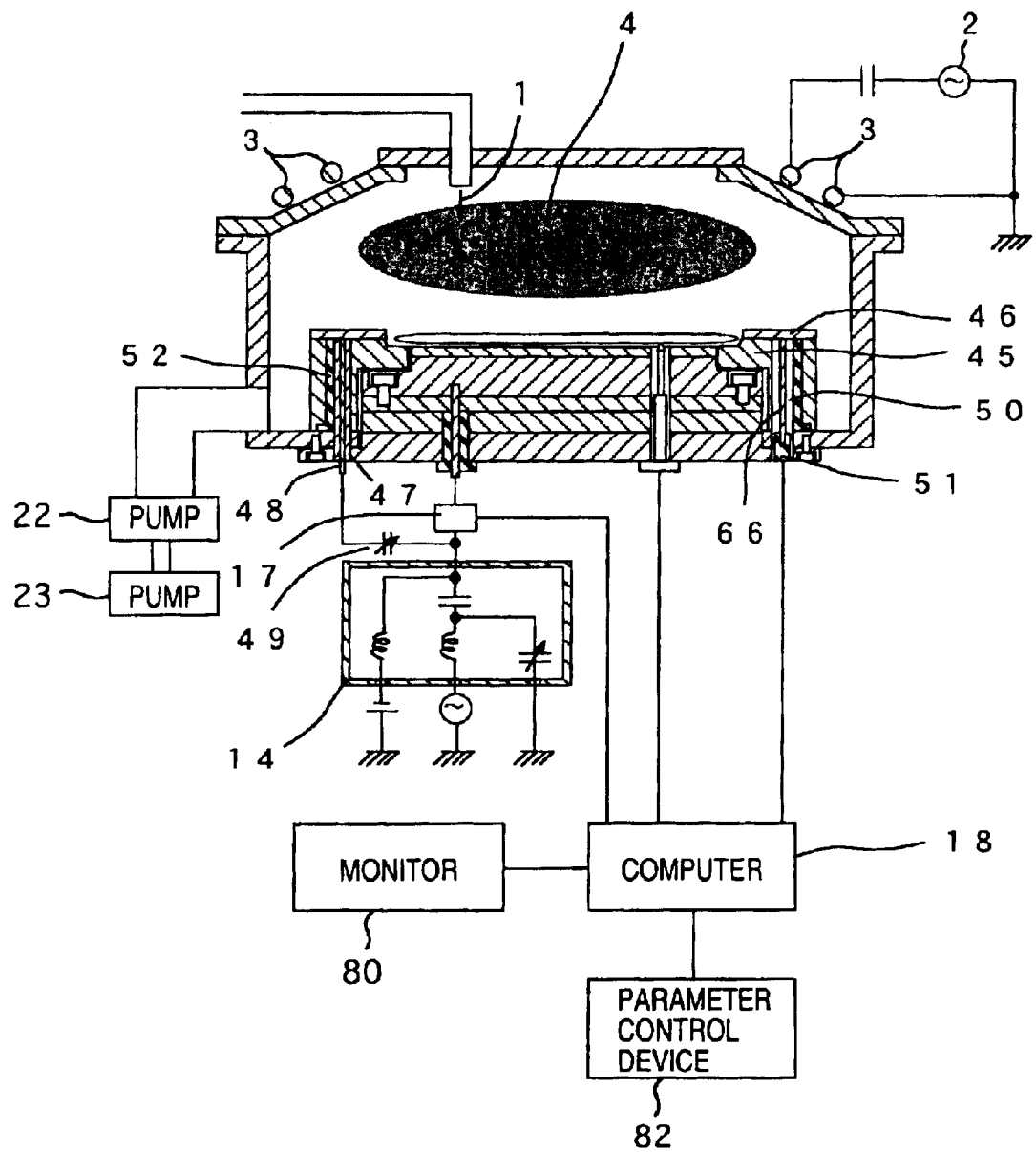
FIG. 6 is a diagram showing a structure example of a plasma etching apparatus according to a third embodiment of the present invention.

Also, this processing can be utilized in the embodiment shown in FIG. 6.

Furthermore, in the present embodiment, as the equivalent circuit model, only the resistance component and the capacitance component of the dielectric film 7 are considered, however, it is not necessarily limited to this, the inductance component between the wafer stage 6 and the high frequency power supply 13, and the capacitance component between the wafer stage 6 and for example, the wall of the vacuum chamber 10, and the like may be included. In this case, more detailed computation of the plasma impedance can be performed, and as a result, the advantage is expected in which the accuracy of the monitoring of the plasma processing and the reproducibility are improved.

As described above, the first embodiment is realized under the condition that the state of the vacuum chamber inner wall is not changed by the plasma processing, or a certain condition is maintained by cleaning, but a problem might arise in a condition that the deposition film is formed on the vacuum chamber inner wall. However, even in such a case, the problem can be avoided by a constitution which is the development of the present embodiment. This will be explained below.

Figure 4:
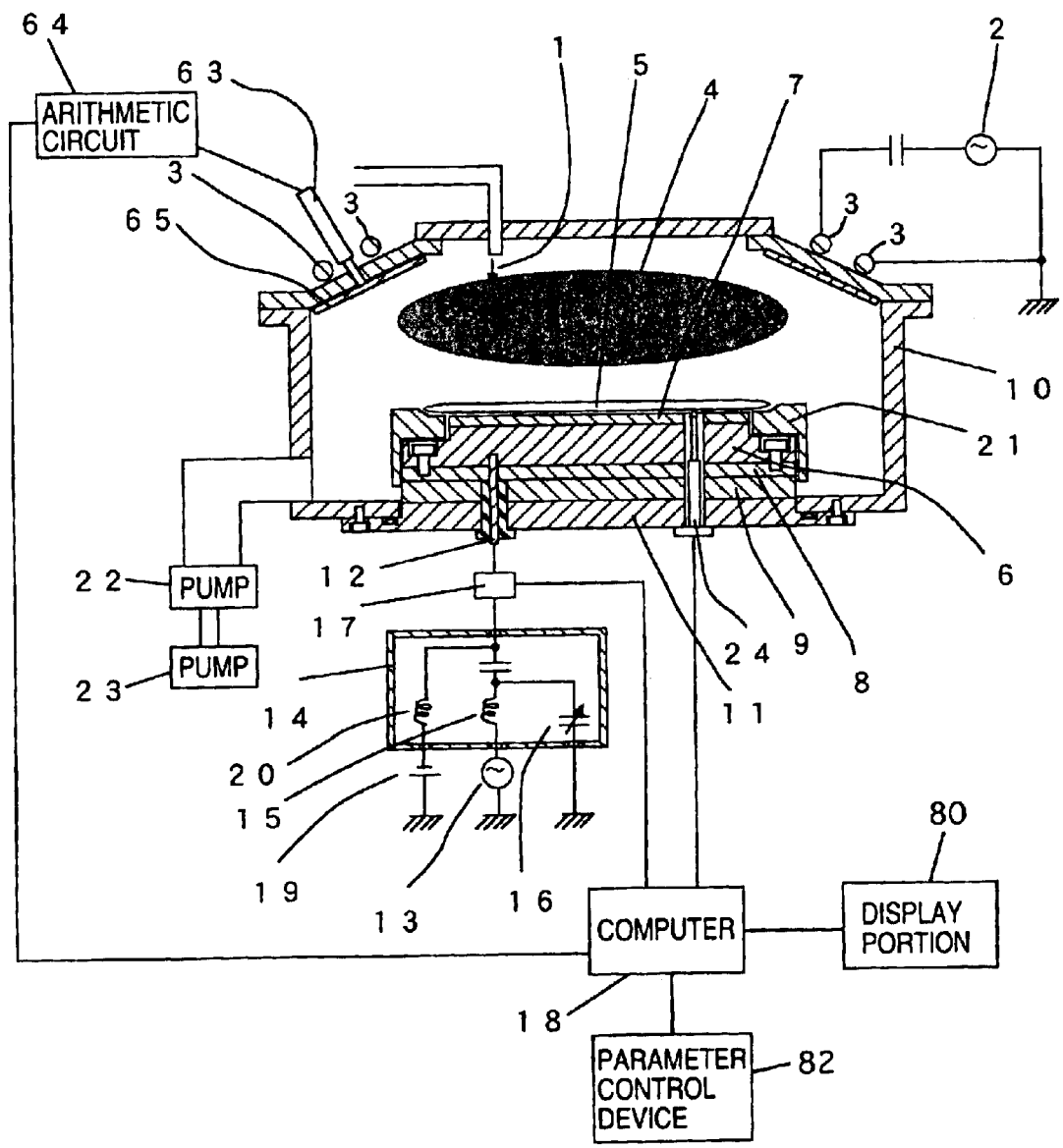
FIG. 4 is a diagram showing a structure example of a plasma etching apparatus according to a second embodiment of the present invention.
Figure 5:
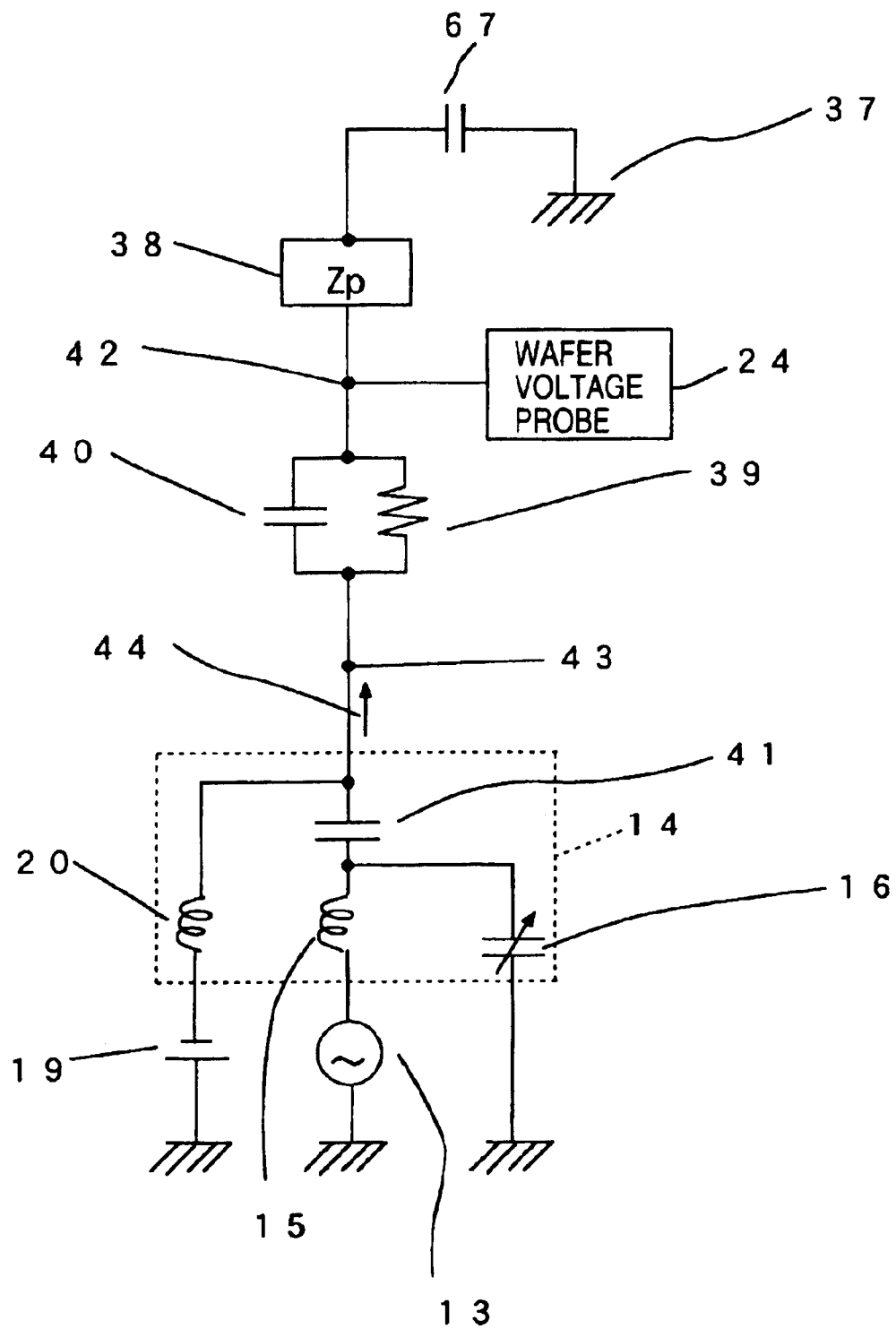
FIG. 5 is an equivalent circuit diagram of an important portion of the second embodiment of the present invention.

FIG. 4 shows a constitution of a second embodiment. FIG. 5 shows an equivalent circuit model from the high frequency power supply 13 (correctly, the current and voltage probe 17) to earth through the wafer stage 6. The present embodiment is implemented in the processing in which a deposition film 65 is attached to the inner wall of the vacuum chamber 10. Due to this deposition film 65, since the impedance from the wafer 5 to earth is changed, it is impossible to accurately obtain the plasma impedance by the method in the first embodiment. Thus, in the present embodiment, in order to obtain the impedance of the deposition film 65, in addition to the apparatus structure of the first embodiment, there are provided with a film thickness probe 63 for measuring a voltage of the plasma during processing, and an arithmetic circuit 64 for calculating a film thickness based on a signal representing the voltage or the like measured by the film thickness probe 63. The film thickness probe 63 and the arithmetic circuit 64 constitute a film thickness probe portion. In this respect, the arithmetic circuit 64 may be provided within the computer 18. As the film thickness probe 63, for example, a crystal resonator type film thickness measuring device and an optical film thickness measuring device utilizing an interference wave, etc. may be included. When the film thickness probe 63 is used, it is possible to measure the thickness of the film deposited on the inner wall of the vacuum chamber 10, and from this thickness of the film, the capacitance 67 and the impedance of the film can be calculated. For example, when the deposition film of a specific inductive capacity ε is attached to a region having an area s, with a thickness T, assuming that the specific inductive capacity of vacuum is ε0, the capacitance Cm of the film is ε ε0 s/T. When the frequency of the high frequency power supply 13 is f, the impedance Zm of the film is ½ π f Cm. At this time, when the plasma impedance Zp is expressed by c+d j, the combined impedance from the wafer 5 to earth is expressed by c+(d–Zm)j. From the equivalent circuit, the combined impedance Ztotal of the resistance component 39 (expressed by R (ohm)) and the capacitance component 40 (expressed by Xc (ohm)) can be expressed by the equation below.

$$Ztotal = (c + R*Xc^2/(R^2 + Xc^2)) + (d - Zm - R^2*Xc/(R^2 + Xc^2))j$$

Since this is the same as the impedance measured by the current and voltage probe 17, by comparing the real number component with the imaginary number component, the values of c and d can be obtained from the equation below. When the impedance at the outlet of the matching box 14 is represented by a+bj similar to the first embodiment, it can be expressed as follows.

$$a = z/(1 + (\tan\theta)^2)^{0.5},$$
$$(b = z*\tan\theta/(1 + (\tan\theta)^2))^{0.5},$$
$$z = Ve/Ie$$

Accordingly, by comparing the real number component with the imaginary number component, and by solving the following equation, c and d can be obtained.

$$Z/(1 + (\tan\theta)^2)^{0.5} = c + R*Xc^2/(R^2 + Xc^2)$$
$$Z*\tan\theta/(1 + (\tan\theta)^2)^{0.5} = d - Zm - R^2*Xc/(R^2 + Xc^2)$$

The magnitude of the plasma impedance at this time can be calculated by $(c^2+d^2)^{0.5}$. Accordingly, if the function to measure the thickness of the deposited film is added to the first embodiment, even in the case where the deposition is attached to the vacuum chamber inner wall and the state of the plasma is changed, the plasma impedance can be calculated accurately, and it is possible to monitor the state of the plasma. Furthermore, since the voltage of the wafer is directly measured by the wafer voltage probe 24, or can be obtained by calculation of the measurement result of the current and voltage probe 17 and the equivalent circuit model, if the voltage of the wafer is controlled based on these information, it is possible to control the energy of the ions incident onto the wafer 5.

Figure 15:
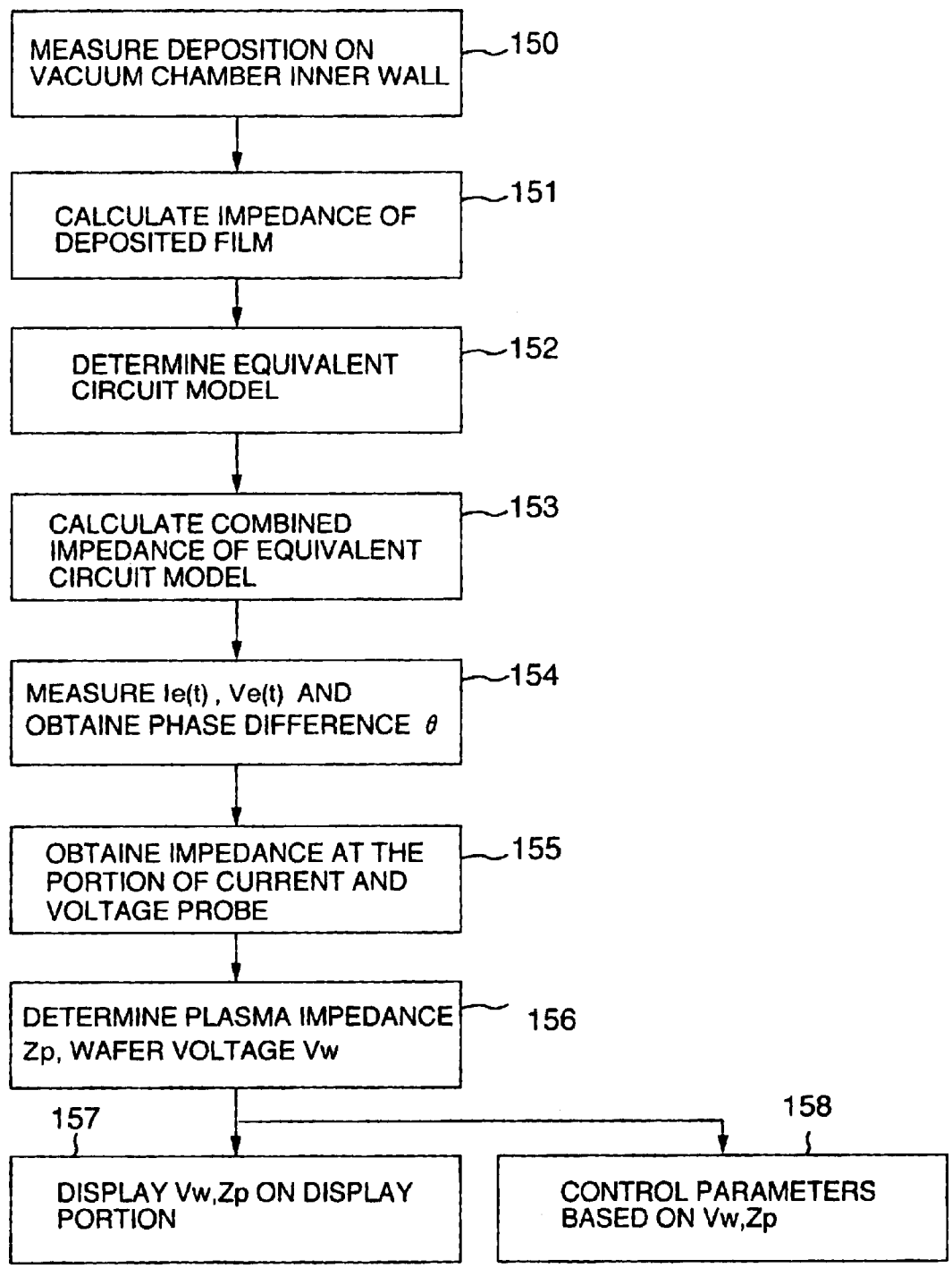
FIG. 15 is a flow chart for explaining a calculation processing of an impedance in the second embodiment.

FIG. 15 shows a flow chart of the flow of process in which the wafer voltage Vw and the plasma impedance Zp are obtained by the method mentioned above, and the obtained information is utilized. First, on the basis of the output of the film thickness probe 63, the thickness of the deposition film attached to the vacuum chamber inner wall is measured (step 150). Next, the impedance of the deposition film is calculated (step 151). Next, the equivalent circuit model is determined (step 152). Next, the combined impedance extending from the current and voltage probe 17 to earth through the plasma 4 and the deposition film 65 is calculated (step 153). Next, by using the current and voltage probe 17, the waveform Vw (t) of the wafer voltage and the waveform Ie (t) of the current of the wafer stage 6 are measured, and the phase difference is obtained (step 154). Next, the impedance at the position of the current and voltage probe 17 is calculated (step 155). Next, the combined impedance previously calculated is compared with the impedance obtained in step 155, and the plasma impedance Zp and the wafer voltage Vw are calculated (step 156). Although, it should be decided eventually by the judgement of the user, in the case of monitoring the wafer voltage Vw and the plasma impedance Zp, these information is displayed on the display portion 80 (step 157), and in the case of controlling the process parameters, the information is sent to the process parameter control device 82, and the process parameters are controlled (step 158).

Therefore, in the present embodiment, similar to the first embodiment, various process parameters can be controlled based on the plasma impedance, and it is possible to provide the manufacturing apparatus with satisfactory reproducibility. Furthermore, the products manufactured by this processing method possesses the feature similar to the first embodiment, in which the price is low and the performance is stable.

Furthermore, the advantageous effect different from the first embodiment will be explained. In the processing in which the film is deposited on the vacuum chamber inner wall, as the processing is continued, the thickness of the film increases gradually. This film is peeled off by the film stress when the thickness reaches a certain thickness, and if this peeled film falls on the wafer, there is a fear of causing a defect product and poses a problem. To cope with this situation, if the thickness of the deposited film is monitored, the advantage is offered in that the time of cleaning can be determined easily, and this enables to avoid the defect products caused by the foreign substance.

Next, FIG. 6 shows a structure of a third embodiment. In this embodiment, the structure includes a susceptor 45 disposed to surround the periphery of the wafer stage 6 in the first embodiment. In this susceptor 45, a silicon plate 46 having a doughnut shape is mounted on the surface of a cover made of ceramics so that the silicon plate 46 is mounted on a face opposing the plasma 4. Furthermore, the silicon plate 46 is connected to a power supply rod 48 which is electrically insulated 47 from other parts, and is connected a feed portion at the outlet of the matching box 14 through a capacitance variable condenser 49 mounted outside the vacuum chamber. Also, the silicon plate 46 has a terminal 50 at the rear surface side and the terminal 50 is electrically connected to the silicon plate 46. The terminal 50 is connected to a susceptor voltage probe 66 which has a socket portion 51 which is electrically insulated from other parts, and a signal from the susceptor voltage probe 66 is led to the outside of the vacuum chamber and fetched to the computer 18 similarly to the first embodiment. Accordingly, by measuring the voltage of a core wire of the susceptor voltage probe 66 by a voltmeter, the voltage of the silicon plate 46 can be measured during processing. Also, in order to measure the voltage of the silicon plate 46, besides such a structure, the voltage of the power supply rod 48 connected to the silicon plate 46 may be measured. The reason for the disposition of the silicon plate 46 on the susceptor surface is that when a gas of fluorine family is used for the etching processing of an oxide film, it is necessary to resolve the non-uniformity of the fluorine radical distribution generated in the surface of the wafer. In other words, although the etching is progressing while the fluorine radical within the plasma is reacting with the silicon within the wafer, since there is a difference in the amount of consumed fluorine radical between the area in which the wafer is actually exists and the area in which the silicon is not present as on the susceptor, the amount of fluorine radical differs between the vicinity of the center of the wafer and the vicinity of the periphery, resulting in the difference in the etching rate. Thus, by disposing the silicon also on the susceptor, the fluorine radical is consumed to the same degree as the area in which the wafer exists, thereby to obtain the uniform distribution. Numeral 52 denotes an earth member for preventing the abnormal discharge from occurring due to the application of the high frequency voltage to the power supply rod 48.

In the present embodiment, in order to positively control the distribution of the fluorine radical in the wafer center area and in the vicinity of periphery, by varying the capacitance of the condenser 49, the bias power supplied from the matching box is appropriately distributed to the wafer stage and to the silicon plate on the susceptor. Hereinafter, the manner of obtaining the plasma impedance above the wafer and the distribution method of the bias power in the present embodiment will be explained.

Figure 7:
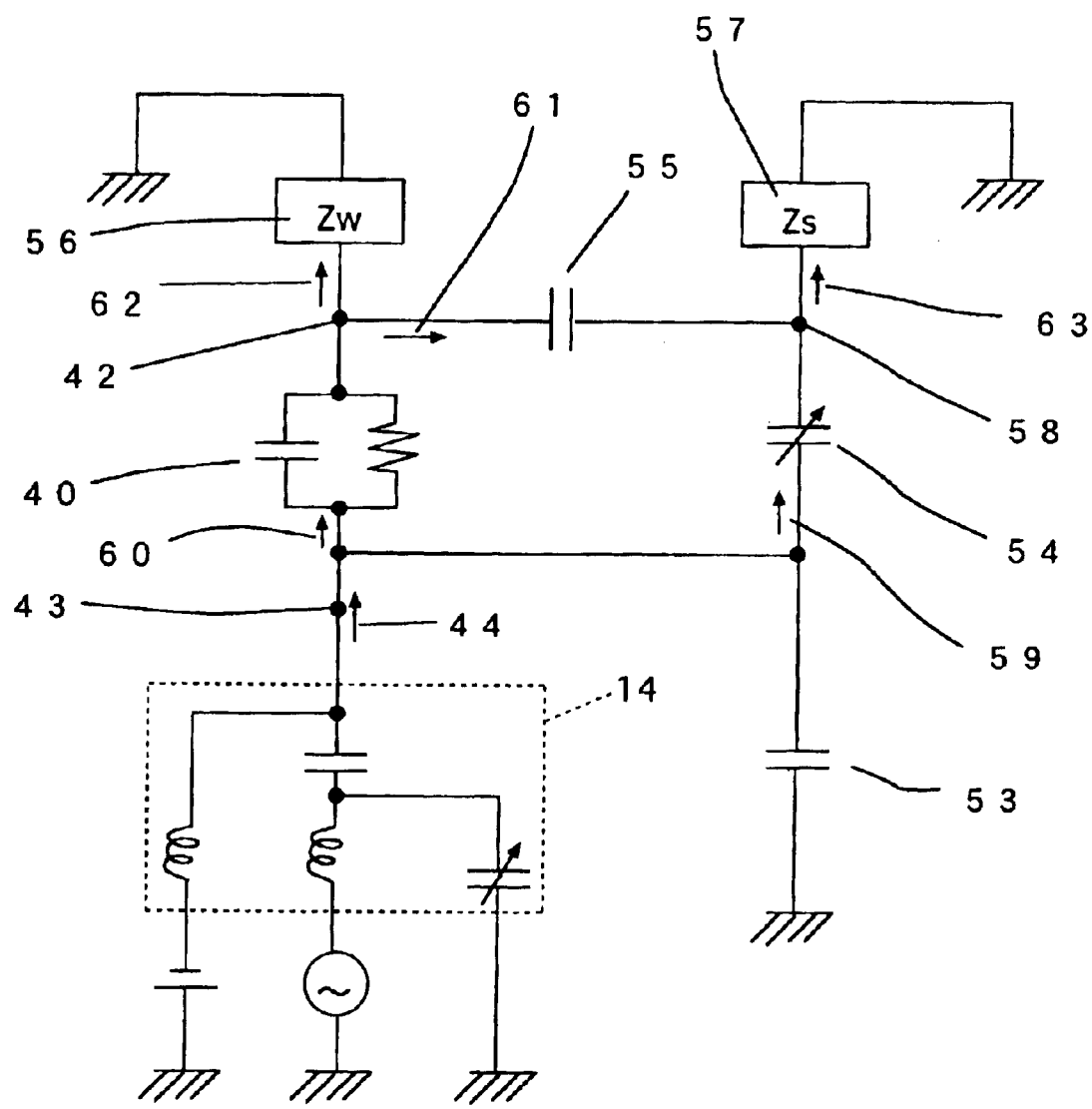
FIG. 7 is an equivalent circuit diagram of an important portion of the third embodiment of the present invention.

FIG. 7 shows an equivalent circuit model in a third embodiment. In the present equivalent circuit model, since the earth member 52 and the silicon plate 46 are added, it is somewhat complicated as compared with the equivalent circuit model in the first embodiment. For example, numeral 53 denotes an electrostatic capacity component of the space existing between the electrode and the earth member, numeral 54 denotes capacitance component of a capacitance variable condenser 49 connected to the silicon plate 46, numeral 55 denotes an electrostatic capacity component between the wafer and the silicon plate 46. The values of these electrostatic capacity components 40, 53, and 55 can be obtained by experiments in the actual apparatus structure, by using a capacitance sensor in the case of applying a high frequency voltage of the same frequency as the bias voltage applied to the wafer stage. In the present embodiment, when the capacitances were actually measured, the results showed that at the time of 800 kHz, the reference numeral 40 was 3 nF, numeral 53 was 0.3 nF, and numeral 55 was 0.1 nF. In the case where such an equivalent circuit model has been grasped in advance, the plasma impedance 56 Zw above the wafer and the plasma impedance 57 Zs above the silicon plate can be calculated by the procedure shown below. First, by the current and voltage probe 17 provided between the outlet of the matching box and the electrode, the waveform Ve (t) of the voltage 43 of the wafer stage and the waveform Ie (t) of the current 44 flowing from the matching box are measured. Next, by using the wafer voltage probe 24 the same as the probe in the first embodiment, the wafer voltage waveform Vw (t) under processing is measured. Furthermore, by measuring the voltage of the terminal 50 by the voltmeter, the waveform Vs (t) of the voltage 58 of the silicon plate under processing is obtained. In the current 44

Ie (t), the current 59 Is (t) flowing into the silicon plate side can be obtained by the equation below, supposing that the impedance of the condenser 54 is expressed by Zc.

$$Is\ (t)=(Vs\ (t)-Ve\ (t))/Zc$$

Here, the impedance Zc can be easily calculated from the frequency of the bias voltage and the capacitance of the condenser 54. Furthermore, the current flows into earth through the capacitance 53 can be calculated by Ve (t)/Z, supposing that the impedance of the capacitance 53 is Z.

Accordingly, in the current 44 Ie (t), the current value 60 Iw (t) which flows to the wafer side can be obtained by the equation below.

$$Iw\ (t)=Ie\ (t)-Is\ (t)-Ve\ (t)/Z$$

Also, the current 61 Iws (t) can be obtained by the equation below, supposing that the impedance between the wafer and the silicon plate is Zws.

$$Iws(t)=(Vw\ (t)-Vs\ (t))/Zws$$

From the above, the current values 62 Izw (t), 63 Izs (t) which flow into the plasma impedance 56 Zw above the wafer and the plasma impedance 57 Zs above the silicon plate can be obtained from the equation below.

$$Izw(t) = Iw(t) - Iws(t)$$

$$Izs(t) = Is(t) + Iws(t)$$

Furthermore, since the voltages Vw (t), Vs (t) have been calculated. Zw, Zs can be obtained from the equation below.

$$Zw = Vw(t)/Izw(t)$$

$$Zs = Vs(t)/Izs(t)$$

Furthermore, in the present structure, by varying the capacitance of the capacitance variable condenser 54, the bias power applied to the wafer and the silicon plate can be arbitrary changed. Thus, in the etching of the oxide film, since it is possible to control the consumption of the fluorine radical, the distribution in the wafer face of the etching can be controlled. Also, since the voltages of the wafer and the silicon plate, and the impedance to earth through the plasma can be measured simultaneously, the etching condition can be controlled based on this signal.

Figure 16:
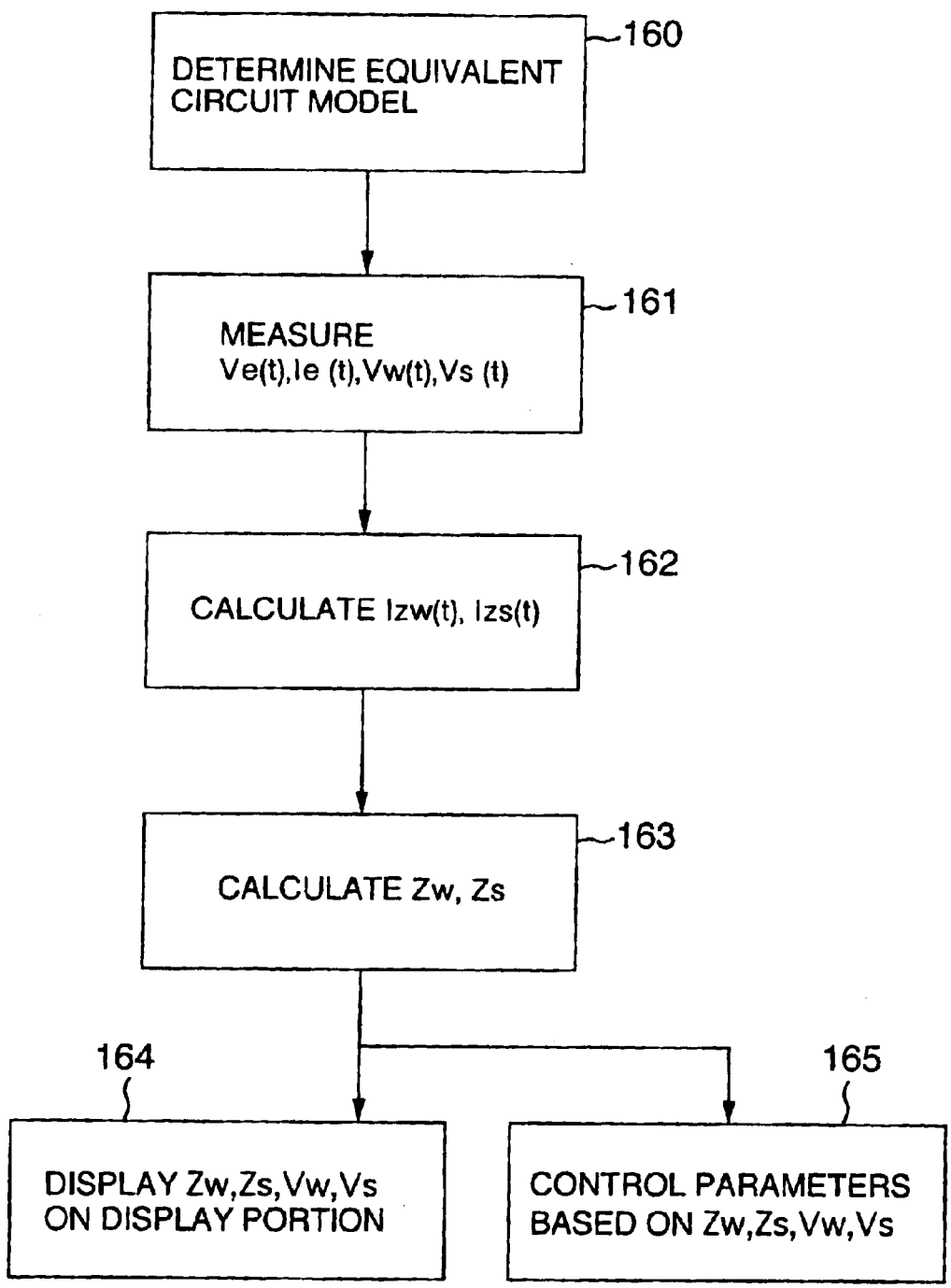
FIG. 16 is a flow chart for explaining another calculation processing of an impedance in the third embodiment.

FIG. 16 shows a flow chart of the processing in which by the method mentioned above, the plasma impedances zw and Zs, and the wafer voltage Vw and the susceptor voltage Vs are obtained, and these values are utilized. First, the equivalent circuit model in the present embodiment shown in FIG. 7 is determined (step 160). Next, by the wafer voltage probe and the susceptor voltage probe, and the current and voltage probe, the voltage waveform Vw (t) of the wafer and the voltage waveform Vs (t) of the susceptor, and the current waveform Ie (t) of the wafer stage are measured (step 161). Next, the current waveform Izw (t) flowing into the plasma from the wafer and the current waveform Izs (t) flowing into the plasma from the susceptor are calculated (step 162). Next, the plasma impedances Zw, Zs are calculated (step 163). Although it should be decided by the judgement of the user eventually, in the case of monitoring the wafer voltage Vs and the susceptor voltage Vs, and the plasma impedances Zw, Zs, theses values are displayed on the display portion 80 (step 164), and in the case of controlling the process parameters, the information is sent to the process parameter control device 82 and the process parameters are controlled (step 165).

An example actually applied to the case where the etching of the oxide film is performed by using a gas of the fluorine family will be explained. When the etching process was performed continuously while simultaneously monitoring the wafer voltage under processing, the silicon plate voltage, the plasma impedance above the wafer, and the plasma impedance above the silicon plate, the phenomenon was observed in which after a certain number of wafers were processed the voltage of the silicon plate increased gradually. From the past experience. since it was known that there was a high possibility that depositions, although the number was very small, were attached on the silicon plate at the time when the number of processed wafers reached the number corresponding to that at which the voltage began to rise, the cleaning of the depositions was conducted by increasing the capacitance of the variable capacitance condenser, and a larger power was applied to the silicon plate in the high frequency bias power applied to the electrode. As a result, it was able to return to the normal processing condition quickly. In this example, in the method heretofore performed, the procedure was such that the cause was not investigated until the unsatisfactory etching occurred, and then the counter measure was taken. As a result, there was a problem in that not only a long time is consumed but also the cost of the waste wafer affected the manufacturing cost. However, in the present embodiment, the advantage is offered in which since the progressing condition of the etching can be grasped while performing the etching, it is possible to cope with quickly. Therefore, the working efficiency of the apparatus is high, and the manufacturing cost can be suppressed low.

Furthermore, during the time when the plasma impedance, and the voltages of the wafer and silicon susceptor during etching are monitored, if a rapid change is observed, there is a high posibility of occurring some problem. In such a case, since it is possible to take necessary measure such as to stop the apparatus, the waste of the wafer can be suppressed to minimum. In other words, it is possible to expect such advantageous effect as to improve the working efficiency of the apparatus, and to reduce the manufacturing cost.

In the present embodiment, although the capacitance variable condenser is used to control the amount of distribution of the bias power to the wafer stage and to the silicon plate from the outlet of the matching box, this is not necessarily required. For example, it is possible to apply the bias voltage by using a different power supply from the power supply which applies the bias voltage to the wafer stage. However, from the view point of the process control, if it is necessary to achieve the coincidence of the phases of the bias voltage applied to the wafer stage and the bias voltage applied to the silicon plate, it is possible to make the phases coincide with each other by providing a separate phase controller.

In the embodiment mentioned above, the voltage of the wafer or the impedance from the wafer to earth, or the voltage of the susceptor and the impedance from the susceptor to earth is monitored, and the detection of the occurrence of abnormality and the control of the high frequency power supply applied to either the wafer stage or the silicon plate on the susceptor, or to both are conducted, however, it is not necessarily limited to this. For example, if the correlation of the phenomena such as the etching rate and the etching rate distribution within the wafer face, the thickness of deposition film deposited on the vacuum chamber, the state of absorption of the wafer by the electrostatic chuck, the occurrence of the damage of elements, and the like, with the wafer voltage and plasma impedance is grasped beforehand, it will be possible to positively change the etching parameters by sequentially comparing with the wafer voltage and the plasma impedance of the wafer under processing, or to decide the time of cleaning. Accordingly, it is possible to expect the advantageous effect of improvement of the yield, and the reduction of the manufacturing cost.

Furthermore, in the present embodiment, as shown in the first embodiment and the second embodiment, it is impossible to obtain the Zs and Zw by calculation from the equivalent circuit model without measuring the voltages 42 and 58 from the rear surface. The reason for is that Zw and Zs respectively have two real number components and imaginary number components, and have the total of four, whereas, the point at which Ve 43 and Ie 44 are measured provides each one real number component and imaginary number component. However, in practice, it can be simply calculate, for example, by making an assumption that zw and zs are distributed according to the ratio of the areas respectively opposing to the plasma. In this case, as explained in the first, and second embodiments, the total combined impedance is obtained by calculation, and it is possible to calculate by comparing the total combined impedance with the impedances at the measuring points of Ve and Ie. In this manner, since there is no need to directly measure the voltage of the wafer and the voltage of the silicon plate, a simplified monitoring method can be provided.

Figure 8:
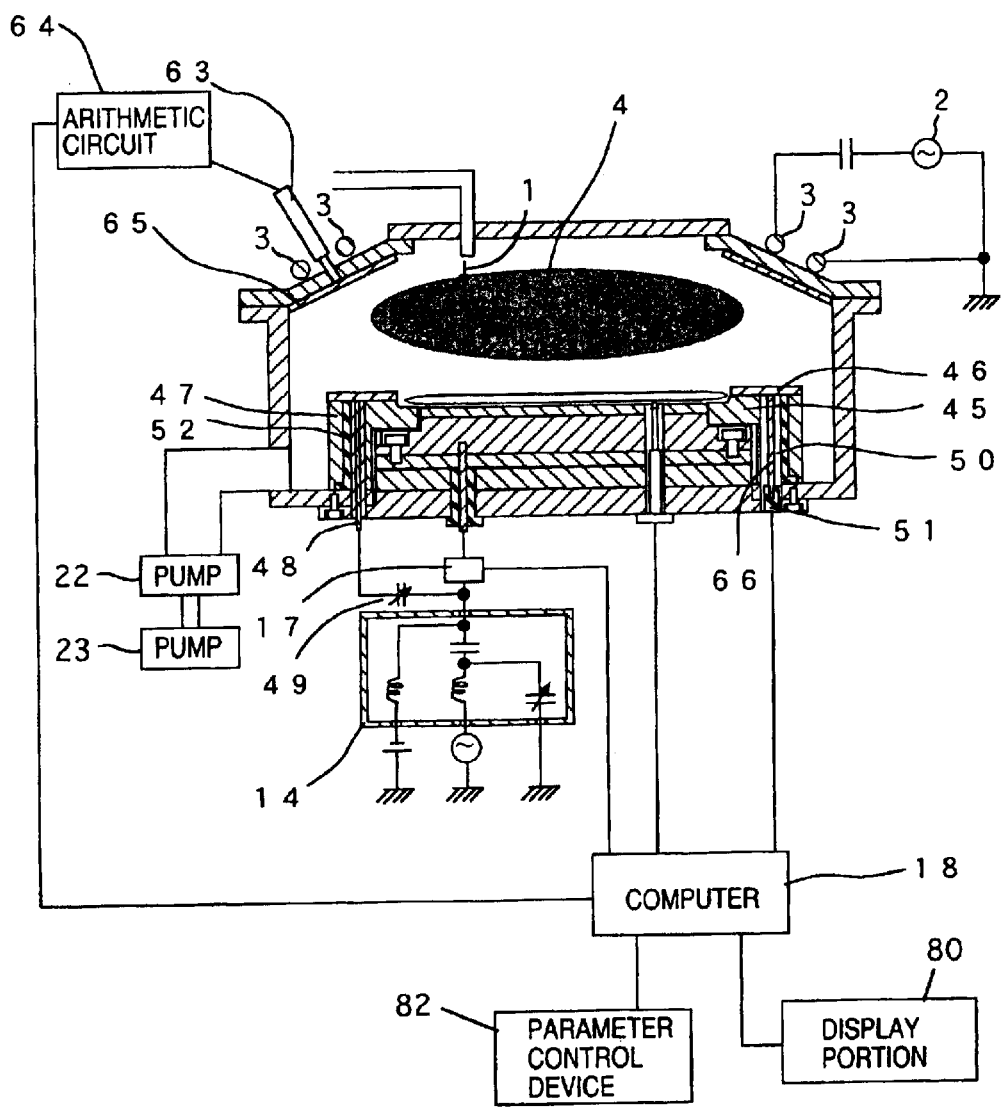
FIG. 8 is a diagram showing a structure example of a plasma etching apparatus according to a fourth embodiment of the present invention.
Figure 9:
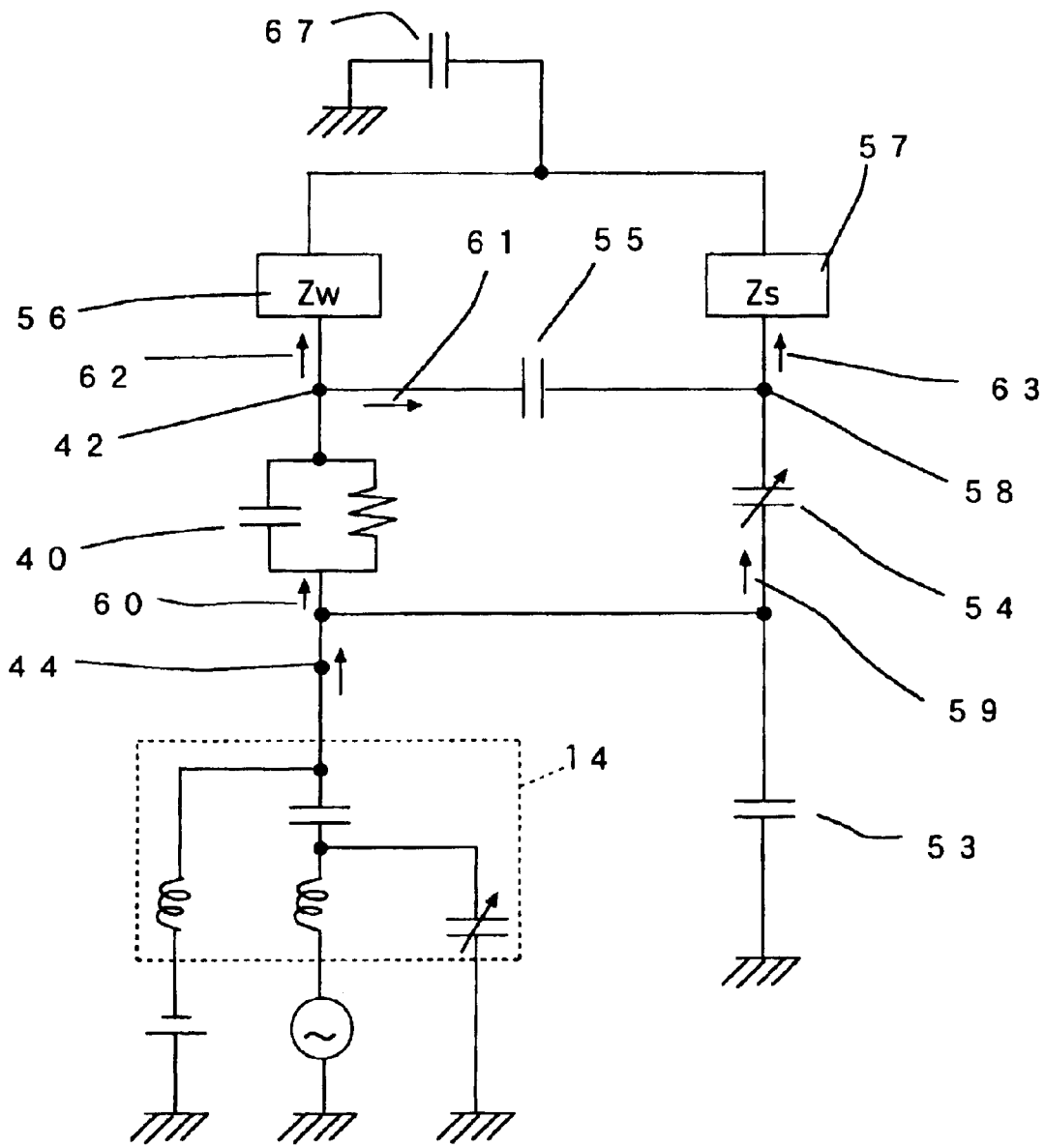
FIG. 9 is an equivalent circuit diagram of an important portion of the fourth embodiment of the present invention.
Figure 10:
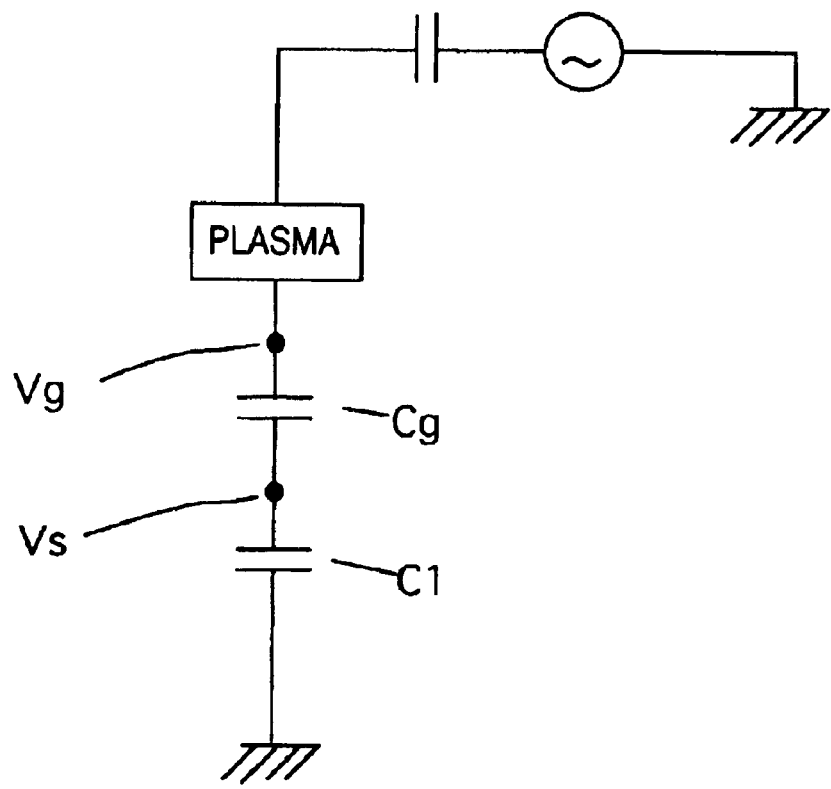
FIG. 10 is an equivalent circuit diagram of an important portion of a plasma etching apparatus according to prior art technique.

FIG. 8 shows a structure of a fourth embodiment of the present invention. FIG. 9 shows an equivalent circuit model from a high frequency power supply (correctly, a current and voltage probe) to earth through a wafer stage. In the present embodiment, a processing is implemented in which a deposition film 65 is attached to an inner wall of a vacuum chamber similar to the second embodiment. In the present embodiment, in order to obtain an impedance of the deposited film 65, in addition to the apparatus structure in the third embodiment, a film thickness probe 63 for measureing the film thickness of the film 65 deposited on the inner wall of the vacuum chamber, and an arithmetic circuit 64 are provided. By using the film thickness probe 63, the film thickness can be measured, and by the procedure similar to that in the second embodiment, the capacitance Cm and the impedance zm can be calculated. Accordingly, by calculating with the addition of the capacitance Cm to the equivalent circuit model of the third embodiment, it is possible to calculate the plasma impedance above the wafer and the plasma impedance above the susceptor 45.

Therefore, when the function of measureing the thickness of the deposition film 65 is added, even in the case where the deposition is deposited on the vacuum chamber inner wall and the state of the plasma has been changed, the plasma impedance can be accurately calculated, and the state of the plasma can be monitored. Furthermore, since the voltage of the wafer and the voltage of the susceptor are directly measured by the voltage probes, or can be obtained by calculation of the measured result of the current and voltage probe 66 and the equivalent circuit model, it is possible to control the energy of ions incident onto the wafer.

Hereinbefore, it is explained as to the example where the present invention is applied to a dry etcher, however, a large advantageous effect can be expected also when the present invention is applied to a plasma CVD apparatus. For example, in the plasma CVD apparatus, since a film is formed on the wafer by using the plasma, the deposition is attached also to the inner wall of the vacuum chamber to a great amount. This deposition, when exceeds a certain thickness, is peeled off from the inner wall of the vacuum chamber and causes a problem of foregin substance contamination of the wafer. However, in the method of the present embodiment, since the thickness of the film deposited on the vacuum chamber inner wall can be predicted, it is possible to determine the time of cleaning before the defect products are produced. In this case, since the wafer is not wasted, the manufacturing cost can be suppressed low. Furthermore, since the wafer voltage and the plasma impedance can be monitored with satisfactory precision, when the applied high frequency voltage is controlled based on the monitored information, the ion energy incident onto the wafer can be controlled and the etching can be realized with good reproducibility. By virtue of this, the improvement of the yield can be expected, and the advantage of reducing the manufacturing cost can be offered.

As mentioned above, according to the present invention, since it is possible to measure the voltage of the wafer and the current flowing in the plasma during processing by using the plasma, the wafer voltage and the plasma impedance can be obtained accurately, and by controlling the etching parameters based on this information, and by controlling the ion energy, it is possible to achieve the etching with good reproducibility, and to prevent the reduction of the yield. That is, the semiconductor manufacturing apparatus can be provided with low manufacturing cost.

Furthermore, since the voltage of the wafer under processing can be directly monitored, when a rapid change of the wafer voltage is observed, the judgement that the etching abnormality is occurring can be made quickly, and the waste of wafer can be suppressed to a minimum. That is, the advantageous effect of reducing the manufacturing cost can be expected.

Furthermore, since it is possible to measure the voltage of the wafer under processing by plasma and the voltage of the silicon susceptor disposed at the periphery of the wafer, the current flowing into the plasma from the wafer, the current flowing into the plasma from the silicon susceptor, the plasma impedance above the wafer and the plasma impedance above the silicon susceptor can be calculated. Accordingly, by controlling the etching condition based on the information of the wafer voltage and the plasma impedance, it is possible to provide the semiconductor manufacturing apparatus capable of etching with good reproducibility.

Furthermore, according to the present invention, since it is possible to distribute the high frequency voltage applied to the wafer and the high frequency voltage applied to the silicon plate, the distribution of the plasma incident onto the wafer can be controlled. Therefore, it is possible to provide the semiconductor manufacturing apparatus capable of controlling the etching distribution within the face of the wafer.

Moreover, according to the present invention, it is possible to provide the probe capable of measuring the wafer voltage under processing by the plasma from the rear surface of the wafer.

What is claimed is:

1. A semiconductor manufacturing apparatus for processing a semiconductor wafer, comprising:
   a unit for generating a plasma in a vacuum chamber;
   a wafer stage for holding a semiconductor wafer introduced into said vacuum chamber;
   a high frequency power supply for applying a high frequency voltage to said wafer stage;

a wafer voltage probe for measuring a voltage of the semiconductor wafer at a rear surface of said semiconductor wafer;

a current and voltage probe for measuring at least one of a voltage and a current applied to said wafer stage from said high frequency power supply;

a calculating portion for obtaining an impedance from said semiconductor wafer to earth through the plasma on the basis of a voltage value measured by said wafer voltage probe, and a voltage value or a current value measured by said current and voltage probe; and a processing portion for performing a processing on the basis of the obtained impedance.

2. A semiconductor manufacturing apparatus according to claim 1, wherein said processing portion displays the obtained impedance on a display portion.

3. A semiconductor manufacturing apparatus according to claim 1, wherein said processing portion controls various processing parameters on the basis of the obtained impedance.

4. A semiconductor manufacturing apparatus according to claim 3, wherein said processing portion regards the obtained impedance as an impedance from said semiconductor wafer to an inner wall of said vacuum chamber through the plasma, and controls various parameters on the basis of the obtained impedance.

5. A semiconductor manufacturing apparatus according to claim 3, wherein said various parameters include a frequency or power of the high frequency voltage for generating said plasma, or the frequency or power of the high frequency voltage applied to said wafer stage, or a temperature or a temperature distribution of a wall forming said vacuum chamber, or a temperature or a temperature distribution of said semiconductor wafer; or at least any one of a pressure of said vacuum chamber, a kind of gases supplied to said vacuum chamber or a flow rate or a mixture ratio of the gases; or at least one kind of a magnetic field applied to the inside of said vacuum chamber, or an etching time.

6. A semiconductor manufacturing apparatus for processing a semiconductor wafer, comprising:

a unit for generating a plasma in a vacuum chamber;

a wafer stage for holding a semiconductor wafer introduced into said vacuum chamber;

a high frequency power supply for applying a high frequency voltage to said wafer stage;

a wafer voltage probe for measuring a voltage of the semiconductor wafer at a rear surface of said semiconductor wafer;

a current and voltage probe for measuring at least one of a voltage and a current applied to said wafer stage from a high frequency power supply;

a Film thickness probe for measuring a thickness of a film deposited on an inner wall of said vacuum chamber;

a calculating portion for obtaining a first impedance from said semiconductor wafer to earth through the plasma on the basis of a voltage value of said semiconductor wafer measured by said wafer voltage probe, and a voltage value or a current value measured by said current and voltage probe, and further obtaining a second impedance of said deposited film from a thickness of the film deposited on the inner wall of said vacuum chamber measured by said film thickness probe, and obtaining an impedance of said plasma by using the first and second impedances; and a processing portion for performing a processing on the basis of at least one of the first impedance and the second impedance.

7. A semiconductor manufacturing apparatus according to claim 6, wherein said processing portion displays at least one of the first impedance and the second impedance on a display portion.

8. A semiconductor manufacturing apparatus according to claim 6, wherein said processing portion controls various processing parameters on the basis of at least one of the first impedance and the second impedance.

9. A semiconductor manufacturing apparatus according to claim 8, wherein said processing portion regards the obtained first impedance as an impedance from said semiconductor wafer to an inner wall of said vacuum chamber through the plasma, and controls various parameters on the basis of the obtained first impedance.

10. A semiconductor manufacturing apparatus for processing a semiconductor wafer, comprising:

a unit for generating a plasma in a vacuum chamber;

a wafer stage for holding a semiconductor wafer introduced into said vacuum chamber;

a high frequency power supply for applying a high frequency voltage to said wafer stage;

a current and voltage probe for measuring at least one of a voltage and a current applied to said wafer stage from said high frequency power supply;

a film thickness probe for measuring a thickness of a film deposited on an inner wall of said vacuum chamber;

a calculating portion for obtaining a first impedance at a position of said current and voltage probe on the basis of a voltage value or a current value measured by said current and voltage probe, and for obtaining a second impedance of said deposited film from a thickness of the film deposited on the inner wall of said vacuum chamber measured by said film thickness probe, and for arithmetic processing a combined impedance of the first and second impedances and an equivalent circuit model from said current and voltage probe to earth through said wafer stage, thereby to calculate an impedance from said semiconductor wafer to the inner wall of said vacuum chamber through the plasma; and a processing portion for performing a processing based on the calculated impedance.

11. A semiconductor manufacturing apparatus according to claim 10, wherein said processing portion displays the calculated impedance on a display portion.

12. A semiconductor manufacturing apparatus according to claim 10, wherein said processing portion controls various processing parameters on the basis of the calculated impedance.

13. A semiconductor manufacturing apparatus for processing a semiconductor wafer, comprising:

a unit for generating a plasma in a vacuum chamber;

a wafer stage for holding a semiconductor wafer introduced into said vacuum chamber;

a susceptor disposed to surround a periphery of said wafer stage;

a high frequency power supply for applying a high frequency voltage to at least one of said wafer stage and said susceptor;

a wafer voltage probe for measuring a voltage of the semiconductor wafer at a rear surface of said semiconductor wafer;

a current and voltage probe for measuring at least one of a voltage and a current applied to said wafer stage from said high frequency power supply;

a susceptor voltage probe for measuring a voltage of said susceptor;

a calculating portion for obtaining a first impedance from said semiconductor wafer to earth through the plasma on the basis of a voltage value of said semiconductor wafer measured by said wafer voltage probe, a voltage value or a current value measured by said current and voltage probe, and a voltage value measured by said susceptor voltage probe, and for obtaining a second impedance from said susceptor to earth through the plasma; and a processing portion for performing a processing based on at least one of the first and the second impedances.

14. A semiconductor manufacturing apparatus according to claim 13, wherein said processing portion displays at least one of the first and the second impedances on a display portion.

15. A semiconductor manufacturing apparatus according to claim 13, wherein said processing portion controls various processing parameters on the basis of at least one of the first and the second impedances.

16. A semiconductor manufacturing apparatus according to claim 15, wherein said processing portion regards the first impedance as an impedance from said semiconductor wafer to an inner wall of said vacuum chamber through the plasma, and controls various parameters on the basis of the first impedance.

17. A semiconductor manufacturing apparatus for processing a semiconductor wafer, comprising:

a unit for generating a plasma in a vacuum chamber;

a wafer stage for holding a semiconductor wafer introduced into said vacuum chamber;

a susceptor disposed to surround a periphery of said wafer stage;

a high frequency power supply for applying a high frequency voltage to at least one of said wafer stage and said susceptor;

a wafer voltage probe for measuring a voltage of the semiconductor wafer at a rear surface of said semiconductor wafer;

a current and voltage probe for measuring at least one of a voltage and a current applied to said wafer stage from said high frequency power supply;

a susceptor voltage probe for measuring a voltage of said susceptor;

a film thickness probe for measuring a thickness of a film deposited on an inner wall of said vacuum chamber;

a calculating portion for obtaining a first impedance from said semiconductor wafer to earth through the plasma, and a second impedance from said susceptor to earth through the plasma, on the basis of a voltage value of said semiconductor wafer measured by said wafer voltage probe, a voltage value or a current value measured by said current and voltage probe, and a voltage value measured by said susceptor voltage probe, and for obtaining a third impedance based on a thickness of a film deposited on an inner wall of said vacuum chamber measured by said film thickness probe, and for obtaining a fourth impedance from said wafer surface to the film deposited on the inner wall of said vacuum chamber and a fifth impedance from said susceptor surface to the film deposited on the inner wall of said vacuum chamber by using the first, the second and the third impedances; and a processing portion for performing a procession based on at least one of the fourth and the fifth impedances.

18. A semiconductor manufacturing apparatus according to claim 17, wherein said processing portion displays at least one of the fourth and the fifth impedances on a display portion.

19. A semiconductor manufacturing apparatus according to claim 17, wherein said processing portion controls various processing parameters on the basis of at least one of the fourth and the fifth impedances.

20. A semiconductor manufacturing apparatus according to claim 19, wherein said processing portion regards the fourth and the fifth impedances as an impedance from said semiconductor wafer to the inner wall of said vacuum chamber through the plasma, and controls various parameters on the basis of the obtained impedance.

21. A semiconductor manufacturing apparatus for processing a semiconductor wafer, comprising:

a unit for generating a plasma in a vacuum chamber;

a wafer stage for holding a semiconductor wafer introduced into said vacuum chamber;

a susceptor disposed to surround a periphery of said wafer stage;

a high frequency power supply for applying a high frequency voltage to said wafer stage and said susceptor independently;

a wafer voltage probe for measuring a voltage of the semiconductor wafer at a rear surface of said semiconductor wafer;

a current and voltage probe for measuring at least one of a voltage and a current applied to said wafer stage from said high frequency power supply;

a susceptor voltage probe for measuring a voltage of said susceptor; and a control portion for controlling the high frequency voltage applied to said wafer stage and said susceptor on the basis of a voltage value of said semiconductor wafer measured by said wafer voltage probe, a voltage value or a current value measured by said current and voltage probe, and a voltage value measured by said susceptor voltage probe.

22. A method of processing a semiconductor wafer, in a semiconductor manufacturing apparatus including a unit for generating a plasma in a vacuum chamber, a wafer stage for holding a semiconductor wafer introduced into said vacuum chamber, and a high frequency power supply for applying a high frequency voltage to said wafer stage, said method comprising the steps of:

measuring a voltage of the semiconductor wafer at a rear surface of said semiconductor wafer;

measuring at least one of a voltage and a current applied to said wafer stage from said high frequency power supply;

obtaining an impedance from said semiconductor wafer to earth through a plasma, on the basis of a voltage value of said semiconductor wafer measured by a wafer voltage probe, and a voltage value or a current value measured by a current and voltage probe; and performing a processing based on the obtained impedance.

23. A method of processing a semiconductor wafer, in a semiconductor manufacturing apparatus including a unit for generating a plasma in a vacuum chamber, a wafer stage for holding a semiconductor wafer introduced into said vacuum chamber, and a high frequency power supply for applying a high frequency voltage to said wafer stage, said method comprising:

measuring at least one of a voltage and a current applied to said wafer stage from said high frequency power supply;

obtaining an impedance at a position of a current and voltage probe on the basis of a voltage value or a current value measured by said current and voltage probe, and arithmetic processing a combined impedance of the obtained impedance and an equivalent circuit model extending from said current and voltage probe to earth through said wafer stage, which equivalent circuit model being prepared beforehand, thereby to calculate an impedance from said semiconductor wafer to earth through the plasma; and performing a processing based on the calculated impedance.

* * * * *